United States Patent
Park et al.

(10) Patent No.: US 8,935,460 B2
(45) Date of Patent: Jan. 13, 2015

(54) MEMORY APPARATUS

(75) Inventors: Young-ho Park, Anyang-si (KR); Seong-jun Ahn, Seoul (KR); Min-cheol Kwon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 391 days.

(21) Appl. No.: 13/547,346

(22) Filed: Jul. 12, 2012

(65) Prior Publication Data

US 2013/0024607 A1 Jan. 24, 2013

(30) Foreign Application Priority Data

Jul. 19, 2011 (KR) .................. 10-2011-0071547

(51) Int. Cl.
```
G06F 12/00    (2006.01)
G06F 13/00    (2006.01)
G06F 13/28    (2006.01)
G06F 12/02    (2006.01)
G11C 29/00    (2006.01)
```

(52) U.S. Cl.
CPC .... *G06F 12/0246* (2013.01); *G06F 2212/7208* (2013.01); *G06F 2212/7202* (2013.01); *G11C 29/82* (2013.01)
USPC ......................... 711/103; 711/159

(58) Field of Classification Search
CPC ..................... G06F 12/0246; G06F 2212/7208
USPC .................................................. 711/103, 159
See application file for complete search history.

(56) References Cited

U.S. PATENT DOCUMENTS

| | | | |
|---|---|---|---|
| 2005/0204187 A1* | 9/2005 | Lee et al. ........................... | 714/8 |
| 2006/0294292 A1* | 12/2006 | Illendula et al. ............... | 711/103 |
| 2007/0150654 A1* | 6/2007 | Shin et al. ...................... | 711/118 |
| 2007/0150694 A1* | 6/2007 | Chang et al. .................. | 711/202 |
| 2009/0282301 A1* | 11/2009 | Flynn et al. .................... | 714/710 |
| 2011/0271043 A1* | 11/2011 | Segal et al. .................... | 711/103 |
| 2012/0215968 A1* | 8/2012 | Uematsu et al. ............... | 711/103 |

FOREIGN PATENT DOCUMENTS

| | | |
|---|---|---|
| JP | 2005-209184 A | 8/2005 |
| JP | 2010-086106 A | 4/2010 |
| KR | 10-0755700 B1 | 7/2007 |
| KR | 10-2010-0028782 A | 3/2010 |

* cited by examiner

*Primary Examiner* — Ryan Bertram
(74) *Attorney, Agent, or Firm* — Harness, Dickey & Pierce

(57) ABSTRACT

A memory apparatus includes first memory chip and second memory chip; and a control unit configured to manage a global reserved area, a first virtual area for the first memory chip, and a second virtual area for the second memory chip, wherein the first virtual area includes a first user area and a first reserved area, the second virtual area includes a second user area and a second reserved area, the global reserved area includes a first plurality of reserved blocks corresponding to the first reserved area and a second plurality of reserved blocks corresponding to the second reserved area, and the control unit is configured to assign a second virtual block included in the global reserved area to the first user area if the control unit detects a first virtual block included in the first user area is a bad block.

19 Claims, 15 Drawing Sheets

FIG. 9

| UA1 OF VA1 |
|---|
| VBL0 |
| VBL1(BB) |
| VBL3 |
| VBL4 |
| VBL5 |
| VBL6 |
| VBL7 |
| VBL8 |
| VBL9(BB) |
| VBL10 |
| VBL11 |
| VBL12 |
| VBL14 |

| UTB | |
|---|---|
| b1 | 1 |
| b2 | 1 |
| b3 | 1 |
| b4 | 1 |
| b5 | 1 |
| b6 | 1 |
| b7 | 1 |
| b8 | 0 |
| b9 | 0 |
| b10 | 0 |

| GRA | |
|---|---|
| VBL11 | ⎫ |
| VBL12 | |
| VBL13(BB) | ⎬ RB1 |
| VBL14 | |
| VBL15(BB) | ⎭ |
| VBL16 | ⎫ |
| VBL17(BB) | |
| VBL18 | ⎬ RB2 |
| VBL19 | |
| VBL20 | ⎭ |

| UA2 OF VA2 |
|---|
| VBL0 |
| VBL1 |
| VBL2 |
| VBL3 |
| VBL4 |
| VBL5(BB) |
| VBL6 |
| VBL7 |
| VBL8 |
| VBL9 |
| VBL10 |
| VBL16 |

FIG. 10

| UA1 OF VA1 |
|---|
| VBL0 |
| VBL1(BB) |
| VBL3 |
| VBL4 |
| VBL5 |
| VBL6 |
| VBL7 |
| VBL8(BB) |
| VBL9(BB) |
| VBL10 |
| VBL11 |
| VBL12 |
| VBL14 |
| VBL18 |

| UTB | |
|---|---|
| b1 | 1 |
| b2 | 1 |
| b3 | 1 |
| b4 | 1 |
| b5 | 1 |
| b6 | 1 |
| b7 | 1 |
| b8 | 1 |
| b9 | 0 |
| b10 | 0 |

| GRA | |
|---|---|
| VBL11 | ⎫ |
| VBL12 | |
| VBL13(BB) | ⎬ RB1 |
| VBL14 | |
| VBL15(BB) | ⎭ |
| VBL16 | ⎫ |
| VBL17(BB) | |
| VBL18 | ⎬ RB2 |
| VBL19 | |
| VBL20 | ⎭ |

| UA2 OF VA2 |
|---|
| VBL0 |
| VBL1 |
| VBL2 |
| VBL3 |
| VBL4 |
| VBL5 |
| VBL6 |
| VBL7(BB) |
| VBL8 |
| VBL9 |
| VBL10 |
| VBL16 |

MEMORY APPARATUS

CROSS-REFERENCE TO RELATED APPLICATIONS

This application claims the benefit of Korean Patent Application No. 10-2011-0071547, filed on Jul. 19, 2011, in the Korean Intellectual Property Office (KIPO), the disclosure of which is incorporated herein in its entirety by reference.

BACKGROUND

The inventive concepts relate to a memory apparatus.

In a memory apparatus including a memory, the memory may include a bad block. The bad block is a block which may not guarantee reliability thereof, and a data write operation may not be performed properly on the bad block.

Thus, a memory apparatus, which may effectively manage a bad block, is desired.

SUMMARY

At least one example embodiment provides a memory apparatus that effectively manages a bad block.

According to an example embodiment, there is provided a memory apparatus including: a first memory chip and a second memory chip; and a control unit configured to manage a global reserved area, a first virtual area for the first memory chip, and a second virtual area for the second memory chip, wherein the first virtual area includes a first user area and a first reserved area, the second virtual area includes a second user area and a second reserved area, the global reserved area includes a first plurality of reserved blocks corresponding to the first reserved area and a second plurality of reserved blocks corresponding to the second reserved area, and the control unit is configured to assign a second virtual block included in the global reserved area to the first user area if the control unit detects a first virtual block included in the first user area is a bad block.

The control unit may be configured to map out the first virtual block from the first user area if the first virtual block does not include a valid page. The control unit may be configured to detect the first virtual block as the bad block if a write operation to the first virtual block fails, perform the write operation on a third virtual block included in the first user area, and the control unit may be configured to detect the first virtual block as the bad block if an erase operation for the first virtual block failed. The control unit may be configured to copy the valid page into a fourth virtual block included in the first user area and then map out the first virtual block from the first user area if the first virtual block detected as the bad block includes the valid page. The first virtual block may be mapped to a logical address before the valid page is copied into the fourth virtual block, and the logical address may be mapped to the fourth virtual block if the valid page is copied into the fourth virtual block. The control unit may be configured to copy the valid page into the fourth virtual block during an idle time.

The first user area and the second user area each may include a free block set that need not be mapped to a logical address, and the control unit may be configured to assign the second virtual block to the free block set of the first user area.

The control unit may be configured to select an unused virtual block of the second plurality of reserved blocks as the second virtual block and assign the second virtual block to the first user area, if there is no unused virtual block from among the first plurality of reserved blocks included in the global reserved area.

The control unit may include: a buffer configured to load a global reserved area table indicating whether the first plurality of reserved blocks and the second plurality of reserved blocks are used; and a processor configured to manage the global reserved area table. The processor may be configured to update the global reserved area table to indicate that the second virtual block is a used block, if the second virtual block included in the global reserved area is assigned to the first user area.

According to another aspect of the inventive concepts, there is provided an electronic apparatus including: a memory including a plurality of memory chips; and a control unit configured to manage a global reserved area and a virtual area for the plurality of memory chips, wherein the virtual area includes a plurality of user areas and a plurality of reserved areas, which correspond to the plurality of memory chips the global reserved area includes a plurality of reserved blocks corresponding to the plurality of reserved areas, and the control unit is configured to assign a second virtual block of the plurality of reserved blocks to the first user area and map out the first virtual block from the first user area if a first virtual block included in a first user area of the plurality of user areas is detected as a bad block.

If the first virtual block includes a valid page, the control unit may be configured to copy the valid page into a virtual block of a plurality of virtual blocks included in the first user area and then map out the first virtual block from the first user area. Each of the plurality of memory chips may include a flash memory. The memory may be included in a solid state drive (SSD). The memory may be included in a server.

According to an example embodiment, there is provided a memory apparatus including: a first memory chip and a second memory chip; and a control unit configured to manage a global reserved area, a first virtual area for the first memory chip and a second virtual area for the second memory chip, wherein the control unit is configured to assign an unused virtual block included in the global reserved area to the first virtual area if the control unit detects a first virtual block included in the first virtual area is a bad block.

The control unit may be configured to map out the first virtual block from the first virtual area if the first virtual block does not include a valid page. The control unit may be configured to detect the first virtual block as the bad block if a write operation to the first virtual block fails, perform the write operation on a third virtual block included in the first virtual area, and the control unit may be configured to detect the first virtual block as the bad block if an erase operation for the first virtual block failed. The control unit may be configured to copy the valid page into a fourth virtual block included in the first virtual area and then map out the first virtual block from the first virtual area if the first virtual block detected as the bad block includes the valid page.

BRIEF DESCRIPTION OF THE DRAWINGS

Example embodiments will be more clearly understood from the following brief description taken in conjunction with the accompanying drawings. FIGS. 1-24 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/ or structural elements may be reduced or exaggerated for clarity. The use of similar or identical reference numbers in the various drawings is intended to indicate the presence of a similar or identical element or feature FIG. 1 is a block diagram of a memory apparatus according to an example embodiment of the inventive concepts;

FIG. 2 is a flowchart illustrating a method of managing a bad block in the memory apparatus of FIG. 1, according to an example embodiment of the inventive concepts;

FIG. 3 is a diagram illustrating an example of physical structures of memory chips of the memory of FIG. 1;

FIG. 4 is a diagram illustrating an example of a virtual area that a control unit of FIG. 1 manages for the plurality of memory chips of FIG. 3;

FIG. 5 is a diagram illustrating an example of a global reserved area of FIG. 4 and a use table for the global reserved area;

FIG. 6 is a diagram illustrating an example of a mapping table for defining a mapping relation between a logical address and a virtual address;

FIG. 7 illustrates an example of a virtual area changed according to FIG. 2;

FIG. 8 is a flowchart illustrating an example of an operation of assigning a second virtual block to a first user area in the method of FIG. 2;

FIG. 9 is a diagram illustrating an example of a virtual area in which an unused virtual block does not exist in first plurality of reserved blocks;

FIG. 10 is a diagram illustrating an example of a virtual area changed from the virtual area of FIG. 9;

FIG. 11 is a flowchart illustrating an example of an operation of mapping out a first virtual block in the method of FIG. 2;

FIG. 12 is a diagram illustrating an example of a case where a bad block is detected due to a failure of a write operation, responsive to a request of a host;

FIG. 13 is a block diagram illustrating an example of a case where a write operation is performed again on a third virtual block;

FIG. 14 is a diagram illustrating an example of a case where a valid page is copied into a fourth virtual block;

FIG. 15 is a diagram illustrating an example of a case where a bad block is detected due to a failure of the write operation during a performance of a garbage collection;

FIG. 16 is a diagram illustrating an example of a case where the write operation is performed again on the third virtual block when a bad block is detected as in FIG. 15;

FIG. 17 is a diagram illustrating an example of a case where a bad block is detected due to a failure of an erase operation;

FIGS. 18 and 19 are diagrams each illustrating an example of a virtual area in the case of managing a bad block differently from the embodiment of the inventive concepts;

FIG. 20 is a diagram illustrating an example of a virtual area for three memory chips, in a case where the memory apparatus according to the embodiment of the inventive concepts include the three memory chips;

FIG. 21 is a block diagram illustrating an example of a computing system including the memory apparatus according to the embodiment of the inventive concepts;

FIG. 22 is a diagram illustrating an example of a memory card according to an embodiment of the inventive concepts;

FIG. 23 is a block diagram illustrating an example of a solid state drive (SSD) according to an embodiment of the inventive concepts; and FIG. 24 is a diagram illustrating an example of a server system including the solid state drive and a network system including the server system.

DETAILED DESCRIPTION

Figure 1:
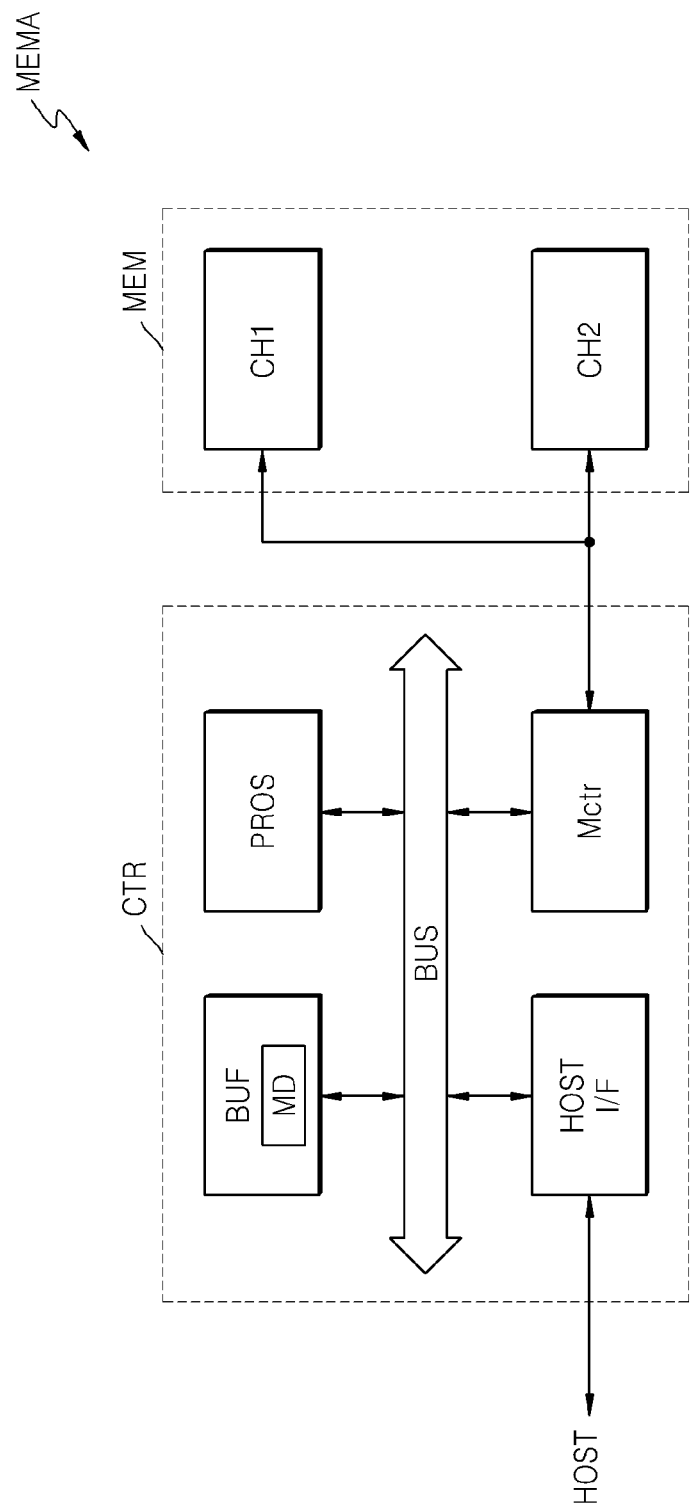

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a", "an", and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. As used herein, the terminology "and/or" includes any one and one or more combinations from among listed items.

It will be understood that, although the terms first, second, third, etc., may be used herein to describe various elements, components, regions, and/or sections, these elements, components, regions, and/or sections should not be limited by these terms. These terms do not mean specific sequences, top and bottom, and merits and demerits, and are only used to distinguish one element, component, region, or section from another element, component, region, or section. Thus, a first element, component, region, or section discussed below could be termed a second element, component, region, or section without departing from the teachings of example embodiments.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. The inventive concepts may be implemented with separate embodiments or a combination of embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram of a memory apparatus MEMA according to an embodiment of the inventive concepts.

Referring to FIG. 1, the memory apparatus MEMA includes a memory MEM and a control unit CTR. The memory MEM includes a plurality of memory chips, namely, first and second memory chips CH1 and CH2. The first and second memory chips CH1 and CH2 may each be a flash memory chip. Although FIG. 1 illustrates a case where the memory apparatus MEMA includes two memory chips, namely, the first and second memory chips CH1 and CH2, FIG. 1 is just an example, and the number of memory chips that are included in the memory apparatus MEMA is not limited thereto.

The control unit CTR controls the memory MEM. For example, the control unit CTR controls or manages overall operations that are performed by the memory MEM. The control unit CTR may include a host interface HOST I/F, a processor PROS, a memory controller Mctr, and a buffer BUF, which are connected to each other through a bus BUS.

The host interface HOST I/F may receive a request of a host (not shown) and then transmit the request of the host to the processor PROS. The request of the host may be a request for writing or a request for reading.

The processor PROS controls the memory controller Mctr so that operations such as a write operation, a read operation, and the like are performed by the memory MEM, and manages metadata MD necessary to control operations such as the write operation, an erase operation, the read operation, and the like in the memory MEM. When the first and second memory chips CH1 and CH2 are flash memory chips, the processor PROS may control the memory controller Mctr so that the erase operation is performed by the memory MEM. In addition, the processor PROS may manage a bad block.

The bad block is a block that may not guarantee reliability thereof. In the bad block, a data write operation or an erase operation may not be performed right. The bad block may be generated during the production of the first and second memory chips CH1 and CH2 and generated due to a continuous use of the first and second memory chips CH1 and CH2.

The memory controller Mctr accesses the memory MEM through a control of the processor PROS and performs operations such as the write operation, the erase operation, the read operation, and the like on the memory MEM.

Information necessary for operation of the processor PROS may be loaded from the memory MEM into the buffer BUF. For example, the metadata MD and the like may be loaded into the buffer BUF. The metadata MD may include information about a virtual area, a table for managing the virtual area, a mapping table for defining a corresponding relation between a logical address and a virtual address, and the like.

Figure 2:
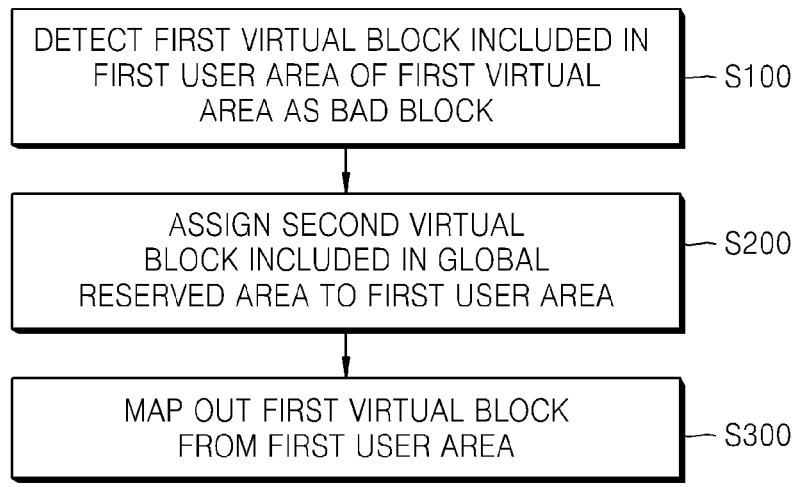

FIG. 2 is a flowchart illustrating a method of managing a bad block in the memory apparatus MEMA of FIG. 1, according to an embodiment of the inventive concepts.

Referring to FIGS. 1 and 2, the processor PROS of the control unit CTR detects a first virtual block included in a first user area of a first virtual area for the first memory chip CH1, as a bad block (Operation S100). The processor PROS assigns a second virtual block included in a global reserved area to the first user area (Operation S200). The processor PROS maps out the first virtual block from the first user area (Operation S300). The map-out implies that the first virtual block is deleted from the first user area.

Figure 3:
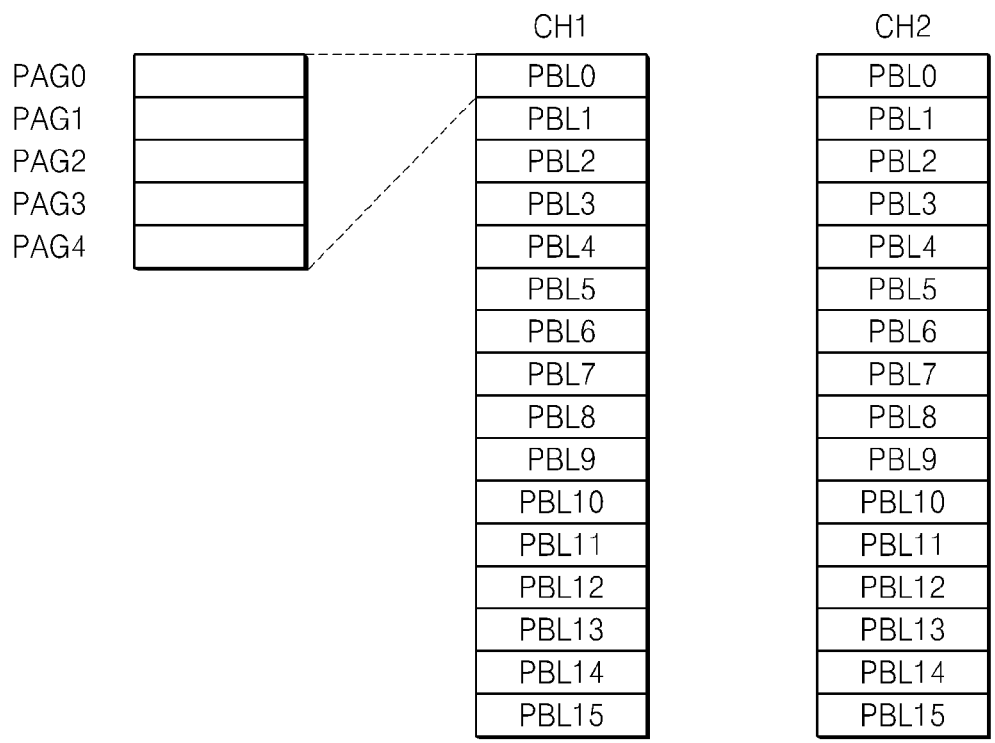

FIG. 3 is a diagram illustrating physical structures of the first and second memory chips CH1 and CH2 of the memory MEM of FIG. 1.

Referring to FIGS. 1 and 3, the first memory chip CH1 and the second memory chip CH2 of the memory MEM each may have a plurality of physical blocks PBL0 through PBL15. Each of the physical blocks PBL0 through PBL15 of the first and second memory chips CH1 and CH2 may include a plurality of pages PAG0 through PAG4.

In FIG. 3, for convenience of illustration, the plurality of pages PAG0 through PAG4 are illustrated only for the No. 0 physical block PBL0 of the first memory chip CH1. However, the other physical blocks PBL1 through PBL15 of the first memory chip CH1 and the physical blocks PBL0 through PBL15 of the second memory chip CH2 also may have the same structure as that of the No. 0 physical block PBL0 of the first memory chip CH1

In addition, in FIG. 3, each of the first and second memory chips CH1 and CH2 includes sixteen physical blocks PBL0 through PBL15 and each of the physical blocks PBL0 through PBL15 includes five pages PAG0 through PAG4. However, FIG. 3 is just an example, and the number of the physical blocks that are included in each of the first and second memory chips CH1 and CH2, and the number of the pages that are included in each of the physical blocks are not limited thereto.

The control unit CTR maps the plurality of physical blocks PBL0 through PBL15 of the first and second memory chips CH1 and CH2 to virtual blocks and manages the virtual blocks as virtual areas.

Figure 4:
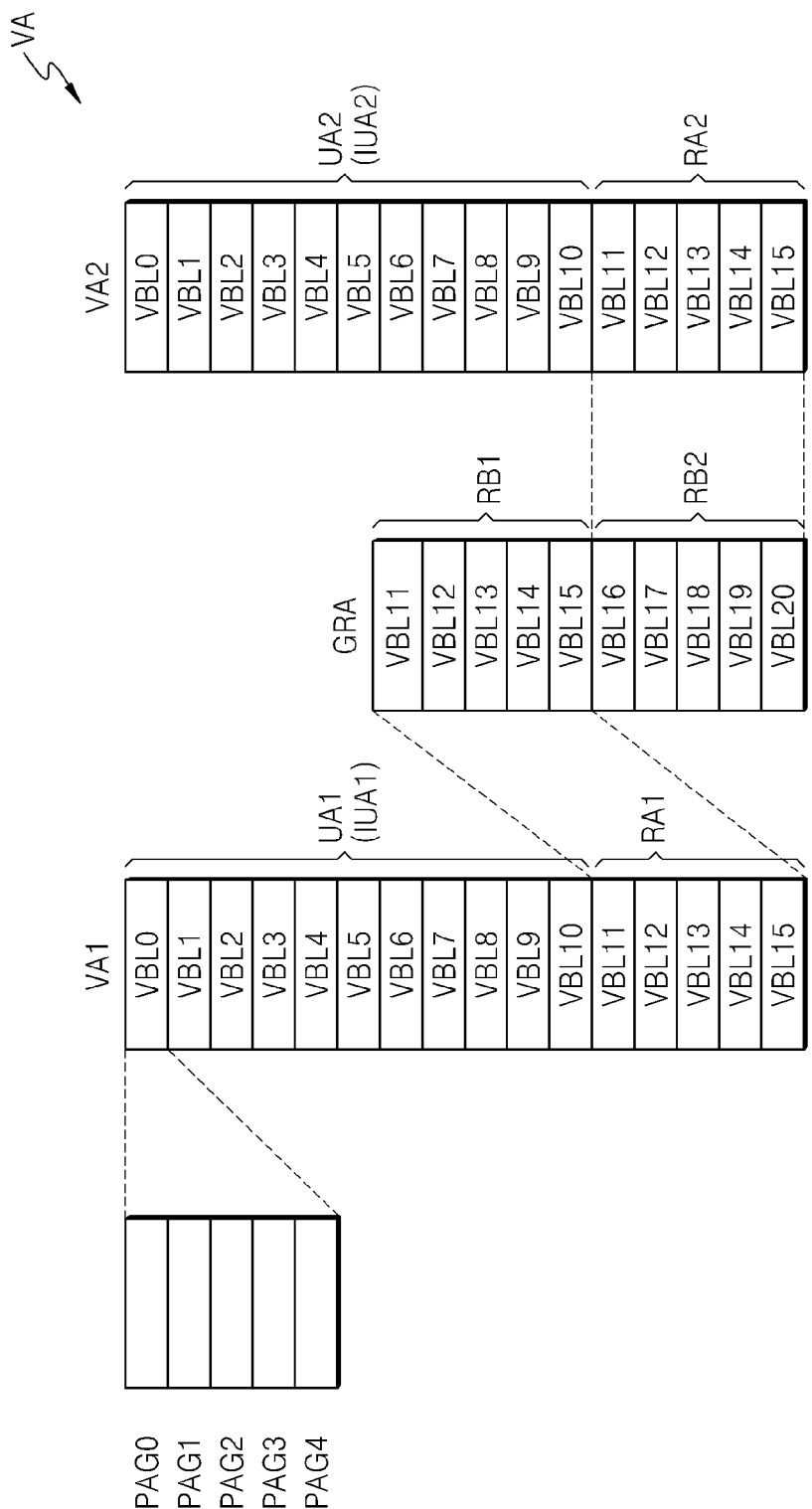

FIG. 4 is a diagram illustrating an example of a virtual area VA that the control unit CTR of FIG. 1 manages for the first and second memory chips CH1 and CH2 of FIG. 3.

Referring to FIGS. 1, 3, and 4, the virtual area VA managed by the control unit CTR includes a global reserved area GRA, a first virtual area VA1 for the first memory chip CH1, and a second virtual area VA2 for the second memory chip CH2.

The first virtual area VA1 includes a plurality of virtual blocks VBL0 through VBL15 that are mapped to the plurality of physical blocks PBL0 through PBL15 included in the first memory chip CH1. For example, the No. 1 physical block PBL1 of the first memory chip CH1 is mapped to the No. 1 virtual block VBL1 of the first virtual area VA1. The plurality of virtual blocks VBL0 through VBL15 as well as the corresponding plurality of physical blocks PBL0 through PBL15 may each include the plurality of pages PAG0 through PAG4.

For example, a virtual address indicating the No. 0 page PAG0 of the No. 2 virtual block VBL2 of the first virtual area VA1 is mapped to the No. 0 page PAG0 of the No. 2 physical block PBL2 of the first memory chip CH1. Thus, the control unit CTR may manage the memory MEM through the virtual address indicating a location in the virtual area VA, and may access the memory MEM through the virtual address.

Data write and read operations of the memory MEM are performed in a unit of a page, and an erase operation of the memory MEM is performed in a unit of a physical block. Thus, the control unit CTR controls the erase operation in a unit of a virtual block, and controls the data write and read operations in a unit of a page of a virtual block. Below, performing an operation such as the write operation, the read operation, the erase operation, or the like on a physical block PBL is regarded as performing the operation on a corresponding virtual block VBL.

The first virtual area VA1 includes a first reserved area RA1 and a first user area UA1. The first user area UA1 is dynamically assigned. Thus, the first user area UA1 may be changed depending on time. The first user area UA1 which may have never been changed by a dynamic assignment may be regarded as a first initial user area IUA1.

An explanation for the first virtual area VA1 may apply to the second virtual area VA2, except that the second virtual area VA2 is a virtual area for the second memory chip CH2. Thus, a repetitive explanation is omitted.

The first and second user areas UA1 and UA2 are areas that are used for data writing and reading, and first and second reserved areas RA1 and RA2 are areas that are reserved to manage a bad block. The first and second user areas UA1 and UA2 may be mapped to logical addresses because the first and second user areas UA1 and UA2 are used for a data writing and reading.

FIG. 4 illustrates a case where it is assumed that the first and second user areas UA1 and UA2 are the same as first and second initial user areas IUA1 and IUA2.

In FIG. 4, the first and second initial user areas IUA1 and IUA2 each include the Nos. 0 through 10 virtual blocks VBL0 through VBL10, and the first and second reserved areas RA1 and RA2 each include the Nos. 11 through 15 virtual blocks VBL11 through VBL15. However, FIG. 4 is just an example, and the inventive concepts are not limited thereto.

The global reserved area GRA includes a first plurality of reserved blocks RB1 (for example, VBL11 through VBL15) corresponding to the first reserved area RA1 (for example, VBL11 through VBL15 of VA1) and a second plurality of reserved blocks RB2 (for example, VBL16 through VBL20) corresponding to the second reserved area RA2 (for example, VBL11 through VBL15 of VA2). For example, the virtual blocks VBL11 through VBL20 included in the global reserved area GRA correspond to the virtual blocks VBL11 through VBL15 included in the first reserved area RA1 for the first memory chip CH1 and the virtual blocks VBL11 through VBL15 included in the second reserved area RA2 for the second memory chip CH2. The global reserved area GRA is an area for effectively managing the plurality of reserved areas, namely, the first and second reserved areas RA1 and RA2 for the first and second memory chips CH1 and CH2, by combining the plurality of reserved areas, namely, the first and second reserved areas RA1 and RA2.

In the global reserved area GRA, the first plurality of reserved blocks RB1 (for example, VBL11 through VBL15) may use the same virtual block numbers as those of the first reserved area RA1. On the contrary, the second plurality of reserved blocks RB2 (for example, VBL16 through VBL20) may use virtual block numbers in which an offset is added to the second reserved area RA2. For example, the No. 12 virtual block VBL12 of the second reserved area RA2 may correspond to the No. 17 virtual block VBL17 of the global reserved area GRA by adding an offset "5" to the No. 12 virtual block VBL12 of the second reserved area RA2. Thus, the No. 17 virtual block VBL17 of the global reserved area GRA corresponds to the No. 12 virtual block VBL12 of the second reserved area RA2 of the second virtual area VA2, and is mapped to the No. 12 physical block PBL12 of the second memory chip CH2.

The global reserved area GRA may be managed through a use table for the global reserved area GRA. The use table indicates whether or not to use the plurality of virtual blocks VBL11 through VBL20 included in the global reserved area GRA. If a virtual block of the global reserved area GRA is assigned to the first or second user area UA1 or UA2 or is a bad block, the use table may indicate that the corresponding virtual block is a used virtual block.

Figure 5:
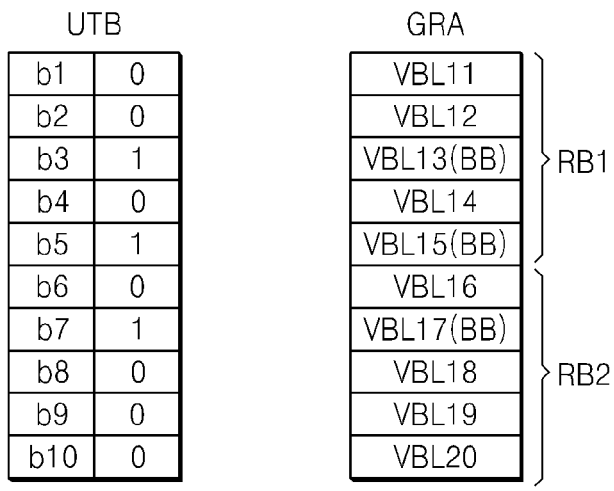

FIG. 5 is a diagram illustrating an example of the global reserved area GRA of FIG. 4 and a use table UTB for the global reserved area GRA.

Referring to FIGS. 4 and 5, the use table UTB for the global reserved area GRA may indicate whether or not to use a virtual block by using a bitmap.

The use table UTB may include a plurality of bits b1 through b10, and each of the plurality of bits b1 through b10 may correspond to a virtual block of the virtual blocks VBL11 through VBL20 included in the global reserved area GRA. Used virtual blocks from among the plurality of virtual blocks VBL11 through VBL20 may be represented as "1" in the use table UTB.

As illustrated in FIG. 5, if, in the use table UTB, the plurality of bits b1 through b10 are "0010101000", meaning that the Nos. 13, 15, and 17 virtual blocks VBL13, VBL15, and VBL17 from among the plurality of virtual blocks VBL11 through VBL20 included in the global reserved area GRA are used virtual blocks. In addition, meaning that the other virtual blocks VBL11, VBL12, VBL14, VBL16, and VBL18 through VBL20 are unused virtual blocks.

The Nos. 13, 15, and 17 virtual blocks VBL13, VBL15, and VBL17 may be bad blocks BB. For example, the Nos. 13, 15, and 17 virtual blocks VBL13, VBL15, and VBL17 may be bad blocks BB generated during the production of the first and second memory chips CH1 and CH2.

The use table UTB may be included in the metadata MD of FIG. 1. Thus, in the memory apparatus MEMA of FIG. 1, the use table UTB may be loaded from the memory MEM into the buffer BUF of the control unit CTR, and the processor PROS of the control unit CTR may manage the global reserved area GRA based on the use table UTB loaded in the buffer BUF. In addition, the processor PROS may update the use table UTB loaded in the buffer BUF.

Figure 6:
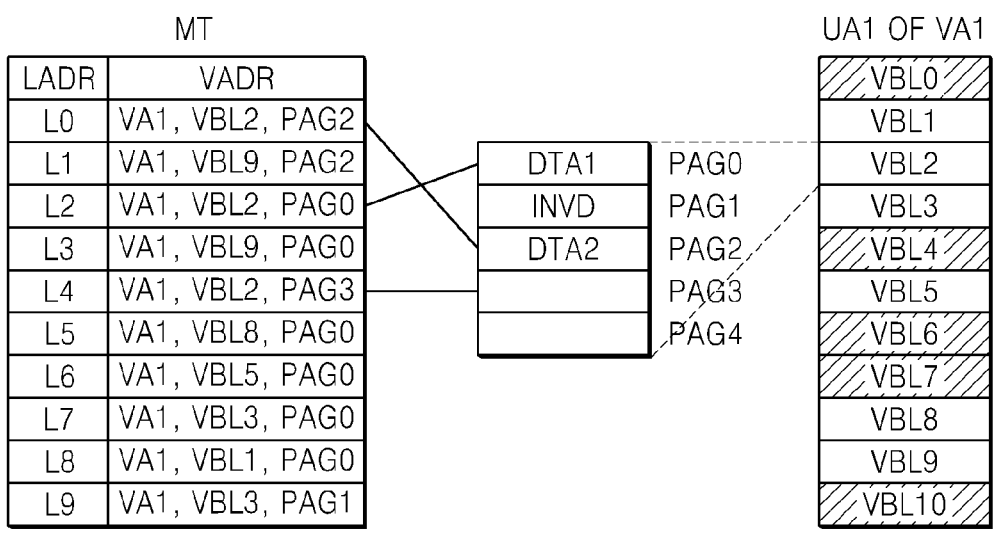

FIG. 6 is a diagram illustrating an example of a mapping table MT for defining a mapping relation between a logical address and a virtual address.

Referring to FIG. 6, the mapping table MT defines a corresponding relation between a plurality of logical addresses LADR (for example, L0 through L9) and a plurality of virtual addresses VADR.

For example, the No. 0 logical address L0 of the mapping table MT is mapped to the No. 2 page PAG 2 of the No. 2 virtual block VBL2 in the first user area UA1 of the first virtual area VA1. Second data DTA2 may be stored in the No. 2 page PAG 2 of the No. 2 virtual block VBL2.

Referring back to FIGS. 1 and 6, the memory apparatus MEMA may receive a read request for the No. 0 logical address L0 from the host. The host interface HOST I/F of the control unit CTR of the memory apparatus MEMA may receive the request for reading from the host and then transmit the request for reading to the processor PROS.

The mapping table MT may be included in the metadata MD. Thus, the mapping table MT may be loaded from the memory MEM into the buffer BUF.

The processor PROS may convert the No. 0 logical address L0 into a virtual address VADR indicating the No. 2 page PAG2 of the No. 2 virtual block VBL2 of the first virtual area VA1, based on the mapping table MT loaded in the buffer BUF.

The processor PROS controls the memory controller Mctr so that a read operation is performed on the No. 2 page PAG2 of the No. 2 virtual block VBL2 of the first virtual area VA1. The memory controller Mctr accesses the memory MEM based on the virtual address VADR converted from the No. 0 logical address L0 and performs the read operation on the memory MEM. Thus, the second data DTA2 is read from the No. 2 page PAG2 of the No. 2 virtual block VBL2 of the first virtual area VA1.

A page, which is mapped to a logical address LADR and in which data, for example, first data DTA1 or second data DTA2 is stored, like the Nos. 0 and 2 pages PAG0 and PAG2 of the No. 2 virtual block VBL2 in the first user area UA1 of the first virtual area VA1, is referred to as a valid page. In addition, data stored in the valid page is referred to as valid data.

The No. 1 page PAG1 of the No. 2 virtual block VBL2 of the first user area UA1 is not mapped to the logical address LADR, but data INVD is stored in the No. 1 page PAG1. Below, a page, which is not mapped to the logical address LADR but in which data, for example, data INVD is stored, is referred to as an invalid page. In addition, data stored in the invalid page is referred to as invalid data. New data may not be written to the invalid page until a virtual block including the invalid page is erased. In the memory MEM, a write operation is performed in a unit of a page, but an erase operation is performed in a unit of a block, and thus, the invalid page may occur.

Referring to the mapping table MT, the Nos. 1 through 3, 5, 8, and 9 virtual blocks VBL1 through VBL3, VBL5, VBL8, and VBL9 of the first user area UA1 of the first virtual area VA1 are mapped to a logical address LADR. On the contrary, the Nos. 0, 4, 6, 7, 10 virtual blocks VBL0, VBL4, VBL6, VBL7, and VBL10 of the first user area UA1 of the first virtual area VA1 are not mapped to a logical address LADR. Below, a group including virtual blocks, which are not mapped to the logical address LADR, of the first user area UA1 is referred to a first free block set FBST1. In FIG. 6, the first free block set FBST1 may include the Nos. 0, 4, 6, 7, and 10 virtual blocks VBL0, VBL4, VBL6, VBL7, and VBL10. All the virtual blocks VBL0, VBL4, VBL6, VBL7, and VBL10 included in the first free block set FBST1 may be erased virtual blocks.

The virtual blocks VBL0, VBL4, VBL6, VBL7, and VBL10 included in the first free block set FBST1 are not mapped to a logical address LADR. However, the virtual blocks VBL0, VBL4, VBL6, VBL7, and VBL10 are virtual blocks that may be mapped to the logical address LADR depending on an operation of the memory apparatus MEMA.

In a case where a new virtual block is necessary for data writing in the memory apparatus MEMA, the new virtual block may be selected from the virtual blocks VBL0, VBL4, VBL6, VBL7, and VBL10 included in the first free block set FBST1. If data is written to the selected virtual block and the selected virtual block is mapped to the logical address, the selected virtual block is no longer included in the first free block set FBST1.

Although, for example, ten logical addresses L0 through L9 are illustrated in FIG. 6, the inventive concepts are not limited to this number. In addition, FIG. 6 is just an example, and the inventive concepts do not limit a mapping relation between the logical address LADR and the virtual address VADR.

In FIG. 6, the logical addresses L0 through L9 are mapped to the first virtual area VA1. However, the logical addresses L0 through L9 may be mapped to the second virtual area VA2.

In addition, although FIG. 6 illustrates an example of a page mapping method in which a mapping is performed in a unit of a page, the inventive concepts are not limited thereto. Various mapping methods such as a block mapping method and a log block mapping method may be used, besides the page mapping method.

In the block mapping method, a mapping is performed in a unit of a virtual block. In the log block mapping method, the plurality of virtual blocks VBL0 through VBL10 included in the first and second user areas UA1 and UA2 are divided into data blocks and log blocks. The block mapping method is used for the data blocks, and the page mapping method is used for the log blocks.

Figure 7:
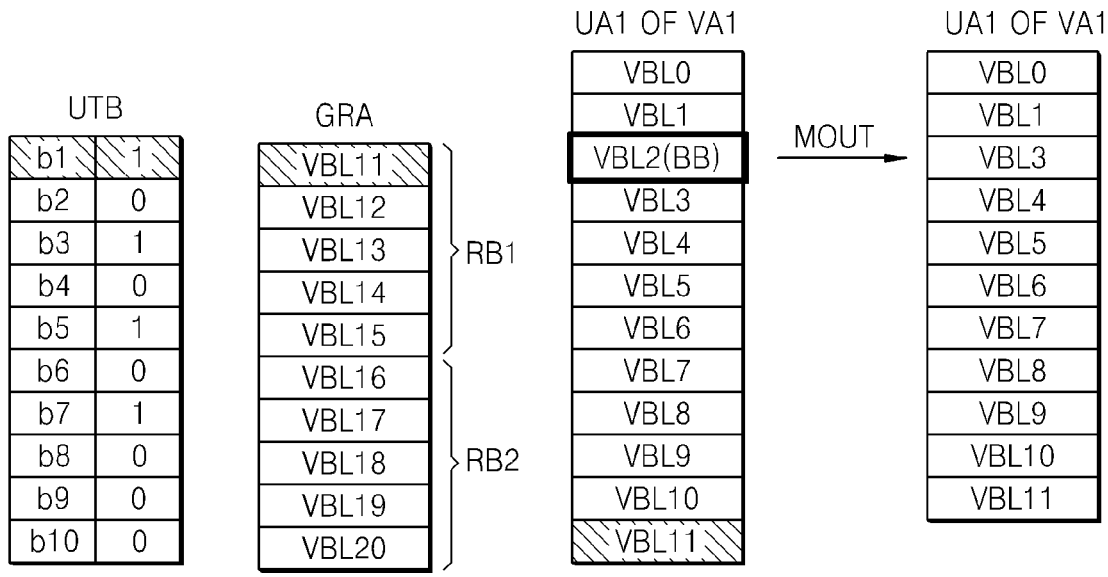

FIG. 7 illustrates an example of a virtual area changed according to FIG. 2. It is assumed that a first user area UA1 of a first virtual area VA1 of FIG. 7 is an area in which the first user area UA1 of FIG. 4 is changed and a global reserved area GRA of FIG. 7 is an area in which the global reserved area GRA of FIGS. 4 and 5 is changed.

Referring to FIGS. 2 and 7, a first virtual block (for example, the No. 2 virtual block VBL2) included in the first user area UA1 of the first virtual area VA1 is detected as a bad block BB (Operation S100).

If the No. 2 virtual block VBL2 is detected as the bad block BB, a second virtual block (for example, the No. 11 virtual block VBL11) included in the global reserved area GRA is assigned to the first user area UA1 (Operation S200). Comparing the first user area (UA1 of FIG. 4) before an assignment of the No. 11 virtual block VBL11 and the first user area (UA1 of FIG. 7) after the assignment of the No. 11 virtual block VBL11, the first user area UA1 of FIG. 7 is changed so that the No. 11 virtual block VBL11 of the global reserved area GRA is included therein. The number of virtual blocks VBL0 through VBL11 included in the first user area (UA1 of FIG. 7) after the assignment of the No. 11 virtual block VBL11 is increased by one, compared to the first user area (UA1 of FIG. 4) before the assignment of the No. 11 virtual block VBL11.

However, in FIG. 7, the No. 11 virtual block VBL11 is just an example of the second virtual block assigned to the first user area UA1. The second virtual block that is assigned to the first user area UA1 may be variously selected from unused virtual blocks VBL11, VBL12, VBL14, VBL16, and VBL18 through VBL20 of FIG. 5 of the plurality of virtual blocks VBL11 through VBL20 included in the global reserved area GRA.

Referring to a use table (UTB of FIG. 5) before the assignment of the No. 11 virtual block VBL11 to the first user area UA1, the No. 11 virtual block VBL11 is an unused virtual block. If the No. 11 virtual block VBL11 is assigned to the first user area UA1, the use table UTB may be updated to indicate that the No. 11 virtual block VBL11 is a used block. For example, as illustrated in FIG. 7, in the use table UTB, a bit b1 corresponding to the No. 11 virtual block VBL11 may be updated from a logic '0' (refer to FIG. 5) to a logic '1'.

The No. 11 virtual block VBL11 assigned to the first user area UA1 may be used for a data writing and reading and mapped to the logical address LADR of FIG. 6. However, the No. 11 virtual block VBL11 is not immediately mapped to the logical address LADR of FIG. 6 by being assigned to the first user area UA1. Thus, the No. 11 virtual block VBL11 assigned to the first user area UA1 may be included in the first free block set FBST1 of FIG. 6.

The No. 2 virtual block VBL2 detected as the bad block BB is mapped out from the first user area UA1 (refer to MOUT of FIG. 7) (Operation S300).

The map-out MOUT implies that a virtual block is deleted from the first or second user area UA1 or UA2. A virtual block mapped out from the first or second user area UA1 or UA2 is no longer mapped to a logical address. Thus, the memory apparatus MEMA of FIG. 1 does not access the mapped-out virtual block and no longer performs operations such as the write operation, the erase operation, the read operation, and the like on the mapped-out virtual block.

If the No. 2 virtual block VBL2 detected as the bad block BB is mapped out, the first user area UA1 includes the virtual blocks VBL0, VBL1, VBL3 through VBL11 of which virtual block numbers are discontinuous.

Before being mapped out, the first user area UA1 is in a state where the number of virtual blocks included therein is increased by one through the assignment of the No. 11 virtual block VBL11. If the No. 2 virtual block VBL2 is mapped out, the number of virtual blocks included in the first user area UA1 becomes the same as that included in the first user area UA1 of FIG. 4 before the assignment of the No. 11 virtual block VBL11.

Next, operation S200 of assigning the second virtual block to the first user area will now be described in detail.

Figure 8:
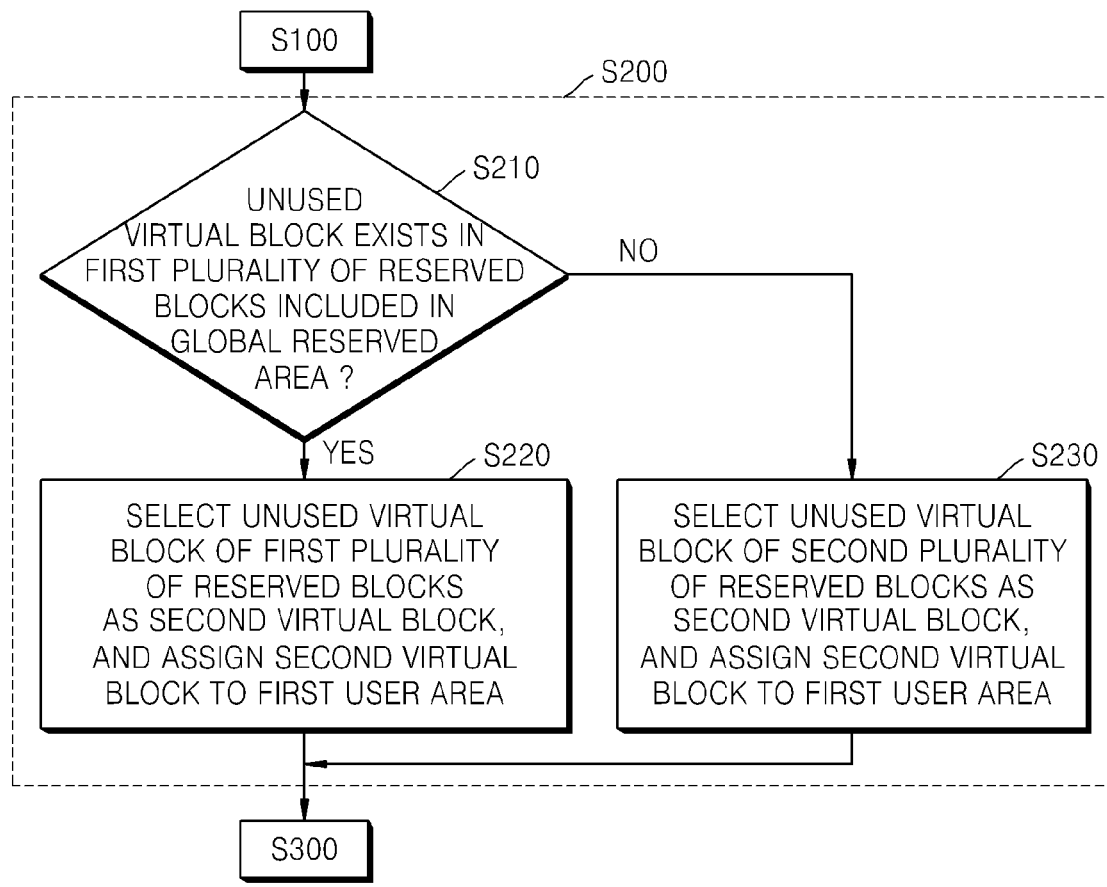

FIG. 8 is a flowchart illustrating an example of operation S200 assigning the second virtual block to the first user area in the method of FIG. 2.

Referring to FIGS. 1, 2, and 8, in operation S200, the processor PROS of the control unit CTR may determine whether an unused virtual block exists in the first plurality of reserved blocks RB1 (refer to FIGS. 4 and 5) included in the global reserved area GRA (refer to FIGS. 4 and 5).

For example, in FIG. 5, the Nos. 11, 12, and 14 virtual blocks VBL11, VBL12, and VBL14 of the first plurality of reserved blocks RB1 included in the global reserved area GRA are unused virtual blocks.

First, a case where, as in FIG. 5, an unused virtual block exists in the first plurality of reserved blocks RB1 included in the global reserved area GRA is explained.

The processor PROS may select an unused virtual block VBL11, VBL12, or VBL14 of the first plurality of reserved blocks RB1 of FIG. 5 as a second virtual block, and may assign the second virtual block to the first user area UA1 of FIG. 4 (Operation S220). If there exist a plurality of unused virtual blocks VBL11, VBL12, and VBL14 of the first plurality of reserved blocks RB1 of FIG. 5, one of the unused virtual blocks VBL11, VBL12, and VBL14 may be selected as the second virtual block.

For example, as in FIG. 7, the No. 11 virtual block VBL11, which is one of the unused virtual blocks of the first plurality of reserved blocks RB1 included in the global reserved area GRA, may be selected as the second virtual block and then assigned to the first user area UA1.

Next, a case where, different from FIG. 5, an unused virtual block does not exist in the first plurality of reserved blocks RB1 included in the global reserved area GRA is explained.

FIG. 9 is a diagram illustrating an example of a virtual area in which an unused virtual block does not exist in the first plurality of reserved blocks RB1.

Referring to a use table UTB of FIG. 9, there is no unused virtual block in the first plurality of reserved blocks RB1 (VBL11 through VBL15) included in the global reserved area GRA. For example, all of the first plurality of reserved blocks RB1 (VBL11 through VBL15) are used virtual blocks.

The Nos. 11, 12, and 14 virtual blocks VBL11, VBL12, and VBL14 of the first plurality of reserved blocks RB1 (VBL11 through VBL15) may have been already assigned to the first user area UA1 of the first virtual area VA1. The first user area UA1 of FIG. 9, similar to the first user area UA1 of FIG. 7, may be an area that is changed after the No. 11 virtual block VBL11 is assigned to the first user area UA1. For example, the Nos. 1 and 9 virtual blocks VBL1 and VBL9 may be detected as bad blocks BB in a state such as FIG. 7, and the Nos. 12 and 14 virtual blocks VBL12 and VBL14 of the global reserved area GRA may be assigned to the first user area UA1, as shown in FIG. 9.

The No. 16 virtual block VBL16 of the second plurality of reserved blocks RB2 (VBL16 through VBL20) may have already been assigned to the second user area UA2 of the second virtual area VA2. For example, the No. 5 virtual block VBL5 of the second user area UA2 may be detected as a bad block BB, and, as shown in FIG. 9, the No. 16 virtual block VBL16 of the global reserved area GRA may be assigned to the second user area UA2.

The Nos. 18 through 20 virtual blocks VBL18 through VBL20 of the second plurality of reserved blocks RB2 (VBL16 through VBL20) are unused virtual blocks.

FIG. 10 is a diagram illustrating an example of a virtual area changed from the virtual area of FIG. 9.

Referring to FIGS. 9 and 10, the No. 8 virtual block VBL8 is detected as a bad block BB again in a state such as FIG. 9.

If there exists no unused virtual block in the first plurality of reserved blocks RB1 included in the global reserved area GRA, as shown in FIG. 9, the processor PROS may select one of unused virtual block VBL18 through VBL20 of the second reserved blocks RB2 as a second virtual block, and may assign the second virtual block to the first user area UA1 (Operation S230 of FIG. 8). If there exists a plurality of unused virtual blocks VBL18 through VBL20 in the second plurality of reserved blocks RB2, one of the unused virtual blocks VBL18 through VBL20 may be selected as the second virtual block.

As illustrated in FIG. 10, the No. 18 virtual block VBL18 of the unused virtual blocks VBL18 through VBL20 may be selected as the second virtual block. The No. 18 virtual block VBL18 is assigned to the first user area UA1. If the No. 18 virtual block VBL18 is assigned to the first user area UA1, the use table UTB may be updated to indicate that the No. 18 virtual block VBL18 is a used block. For example, as illustrated in FIG. 10, a bit b8 corresponding to the No. 18 virtual block VBL18 in the use table UTB may be updated from a logic '0' (refer to FIG. 9) to a logic '1'.

In this manner, if the first virtual block included in the first user area UA1 of the first virtual area VA1 for the first memory chip CH1 of FIG. 1 is detected as a bad block, the second virtual block assigned to the first user area UA1 may be selected from among the first plurality of reserved blocks RB1 rather than the second plurality of reserved blocks RB2. This is because the first plurality of reserved blocks RB1 are virtual blocks for the first memory chip CH1.

Figure 11:
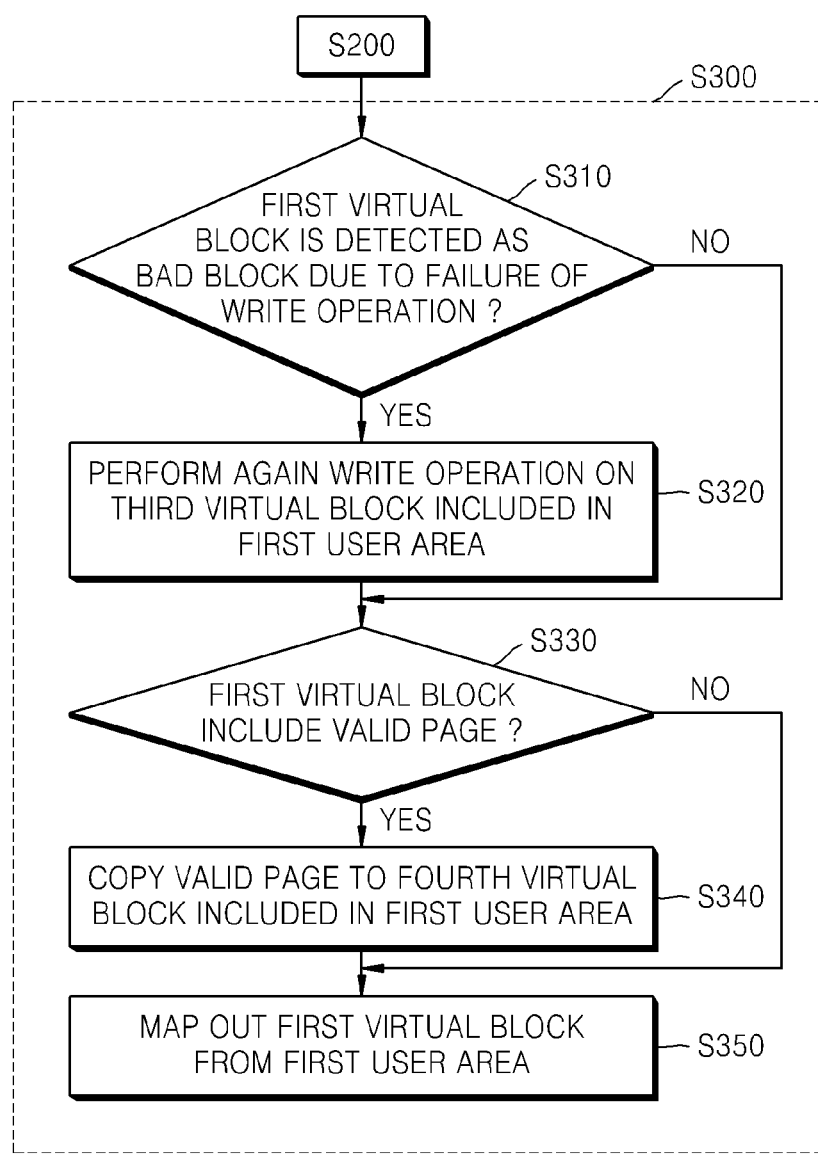

FIG. 11 is a flowchart illustrating an example of operation S300 of mapping out the first virtual block in the method of FIG. 2.

Referring to FIGS. 1, 2, and 11, in operation S300, the processor PROS of the control unit CTR may determine whether the first virtual block is detected as a bad block due to a failure of the write operation (Operation S310).

If it is determined that the first virtual block is detected as a bad block due to a failure of the write operation, the processor PROS may again perform the write operation on a third virtual block included in the first user area (Operation S320). If the write operation is performed again in operation S320 or if it is determined that the first virtual block is not detected as a bad block due to a failure of the write operation, the processor PROS may determine whether the first virtual block detected as a bad block includes a valid page (Operation S330).

If the first virtual block includes the valid page, the processor PROS may copy the valid page to a fourth virtual block included in the first user area (Operation S340). If the valid page is copied to the fourth virtual block in operation S340 or the first virtual block does not include the valid page, the processor PROS maps out the first virtual block from the first user area (Operation S350).

Although a case where operation S330 and operation S340 are performed after operation S310 and operation S320 is illustrated in FIG. 11, this case is just an example. For example, operation S330 and operation S340 may be performed simultaneously with operation S310 and operation S320 or before operation S310 and operation S320.

Below, each of the operations of FIG. 11 is explained in detail.

Figure 12:
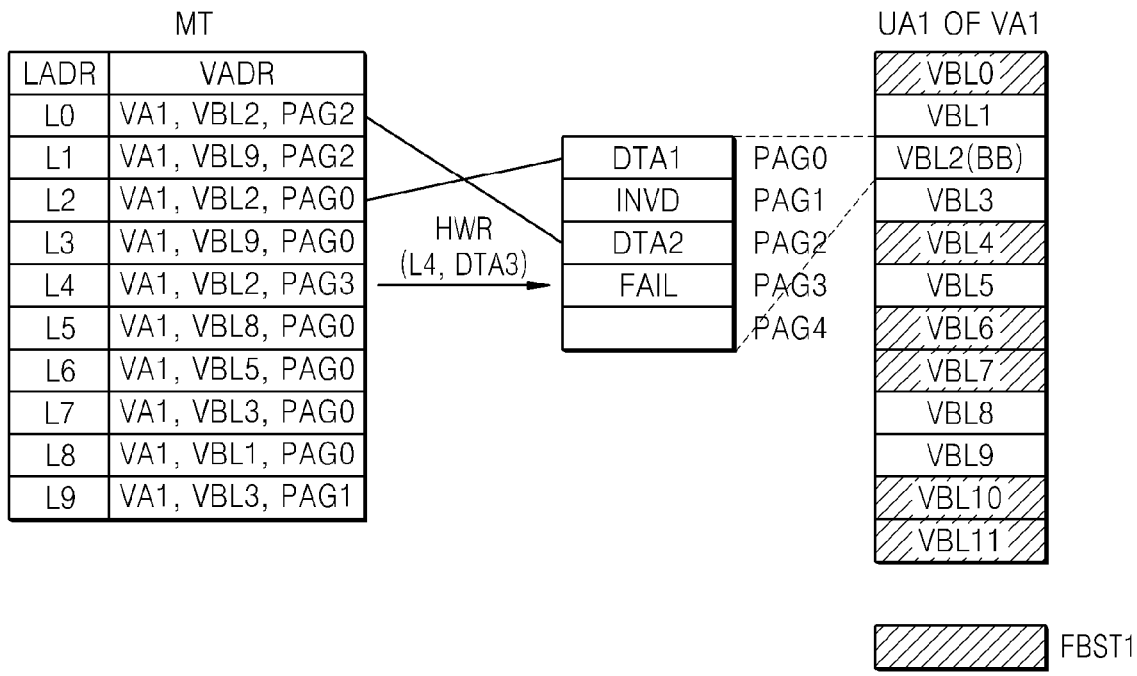

FIG. 12 is a diagram illustrating an example of a case where a bad block is detected due to a failure of the write operation, responsive to a request of the host.

Referring to FIG. 12, the No. 2 virtual block VBL2 included in the first user area UA1 of the first virtual area VA1 is detected as a bad block BB due to a failure of a request HWR for writing from the host.

It is assumed that, in the No. 2 virtual block VBL2 before the request HWR for writing, similar to the case of FIG. 6, data DTA1, INVD, and DTA2 is stored in the Nos. 0 through 2 pages PAG0 through PAG2.

The request HWR for writing may include the No. 4 logical address L4 and third data DTA3. The No. 4 logical address L4 is mapped to the No. 3 page PAG 3 of the No. 2 virtual block VBL2 of the first virtual area VA1. An operation of writing the third data DTA3 is performed on the No. 3 page PAG 3 in response to the request HWR for writing. If the write operation failed, the No. 2 virtual block VBL2 is detected as a bad block BB.

If the No. 2 virtual block VBL2 is detected as the bad block BB, the No. 11 virtual block VBL11 of the global reserved area GRA of FIG. 7 may be assigned to the first user area UA1.

Because the No. 11 virtual block VBL 11 assigned to the first user area UA1 is not mapped to a logical address LADR, the No. 11 virtual block VBL11 is included in the first free block set FBST1 of the first user area UA1. Thus, the first free block set FBST1 includes the Nos. 0, 4, 6, 7, 10, and 11 virtual blocks VBL0, VBL4, VBL6, VBL7, VBL10, and VBL11.

Referring back to FIGS. 1, 2, 11, and 12, if the No. 2 virtual block VBL2 is detected as a bad block due to a failure of the write operation, as illustrated in FIG. 12, the processor PROS again performs the write operation on the third virtual block included in the first user area UA1 (Operation S320).

Here, it is not necessary that the third virtual block be the same as the No. 11 virtual block VBL11 assigned to the first user area UA1 from the global reserved area GRA of FIG. 7. The third virtual block may be selected from among the virtual blocks included in the first user area UA1. For example, the No. 11 virtual block VBL11 may be selected as the third virtual block.

Figure 13:
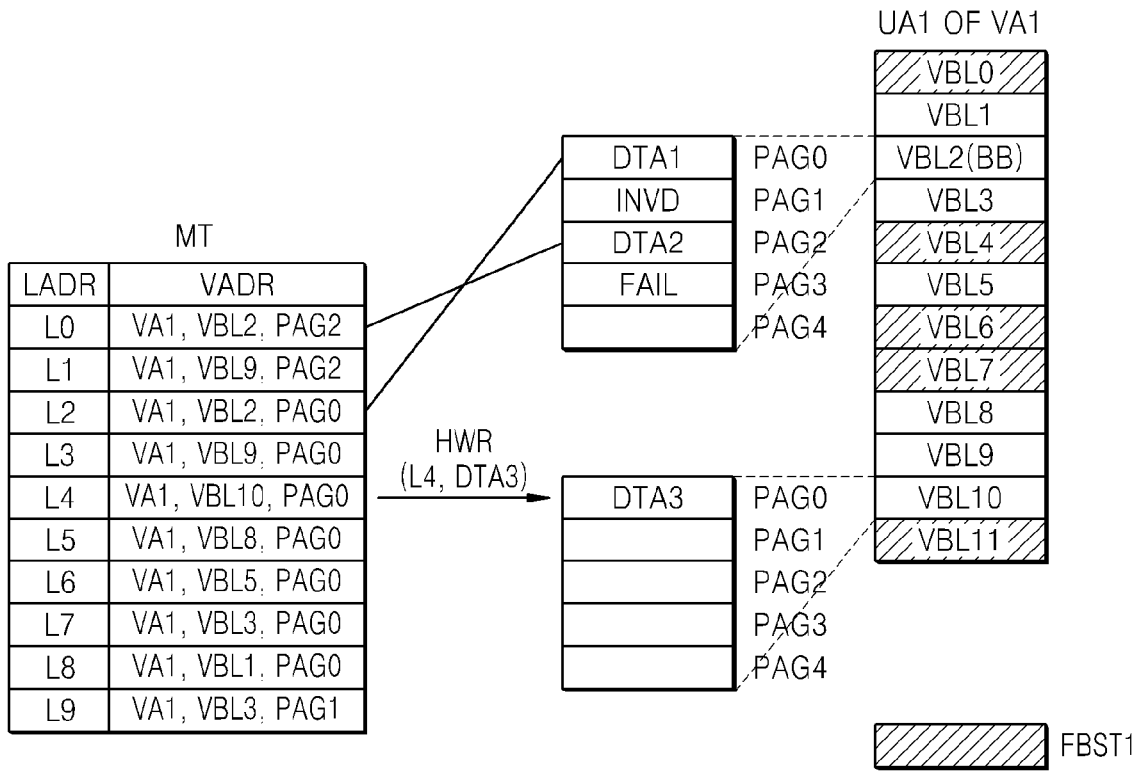

FIG. 13 is a block diagram illustrating an example of a case where a write operation is performed again on the third virtual block. As illustrated in FIG. 12, if the No. 2 virtual block VBL2 is detected as a bad block BB due to a failure of the write operation, responsive to the request HWR for writing, the write operation, responsive to the request HWR for writing, is performed again on the third virtual block (for example, the No. 10 virtual block VBL10) included in the first user area UA1 of the first virtual area VA1.

By again performing the write operation, the third data DTA3 is stored in the No. 0 page PAG0 of the No. 10 virtual block VBL10.

As stated above, in FIG. 12, the logical address L4 included in the request HWR for writing is mapped to the No. 3 page PAG 3 of the No. 2 virtual block VBL2 of the first virtual area VA1. However, in FIG. 13, the mapping table MT may be updated so that the logical address L4 included in the request HWR for writing is mapped to the No. 0 page PAG 0 of the No. 10 virtual block VBL10 of the first virtual area VA1.

In FIG. 13, the No. 10 virtual block VBL10 included in the first free block set FBST1 in FIG. 12 is selected as the third virtual block. However, FIG. 13 is just an example. For example, the third virtual block is not limited to the virtual blocks included in the first free block set FBST1 but may be variously selected from among the virtual blocks included in the first user area UA1. The third virtual block may be variously selected based on a wear leveling or a mapping method. For example, a method of re-mapping a new virtual address to the No. 4 logical address L4 may be variously determined.

Referring back to FIGS. 1, 2, and 11, if the first virtual block is not detected as a bad block due to a failure of the write operation or the write operation is performed again (Operation S320), the processor PROS may determine whether the first virtual block detected as a bad block includes a valid page (Operation S330).

If the first virtual block includes the valid page, the processor PROS may copy the valid page to a fourth virtual block included in the first user area (Operation S340). If the first virtual block does not include the valid page or the valid page is copied to the fourth virtual block in operation S340, the processor PROS maps out the first virtual block from the first user area (Operation S350).

Figure 14:
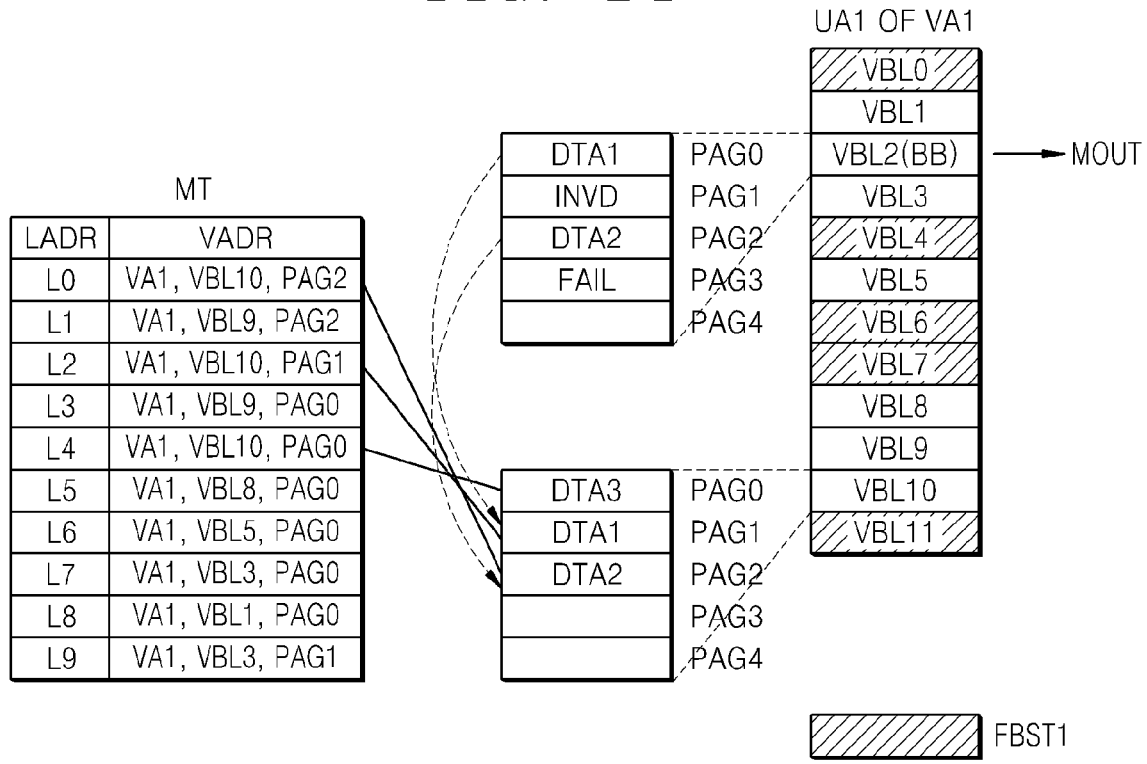

FIG. 14 is a diagram illustrating an example of a case where the valid page is copied into the fourth virtual block. FIG. 14 is a case where it is assumed that the No. 10 virtual block VBL10 of the first user area UA1 in FIG. 13 is the fourth virtual block.

Referring to FIGS. 13 and 14, in a case where the write operation is performed again as shown in FIG. 13, the No. 0 and No. 2 pages PAG0 and PAG2 of the No. 2 virtual block VBL2 detected as a bad block BB are valid pages. This is because the No. 0 and No. 2 pages PAG0 and PAG2 of the No. 2 virtual block VBL2 in FIG. 13 are mapped to logical addresses LADR (L2 and L0). Thus, the memory apparatus MEMA of FIG. 1 may access the No. 0 and No. 2 pages PAG0 and PAG2 of the No. 2 virtual block VBL2, and may read valid data DTA1 and DTA2 from the No. 0 and No. 2 pages PAG0 and PAG2 of the No. 2 virtual block VBL2.

The valid pages PAG0 and PAG2 of the No. 2 virtual block VBL2 may be copied to the No. 1 and No. 2 pages PAG1 and PAG2 of the No. 10 virtual block VBL10, as shown in FIG. 14 (refer to operation S340 of FIG. 11).

Here, the mapping table MT may be updated so that the logical addresses L2 and L0 mapped to the No. 0 and No. 2 pages PAG0 and PAG2 of the No. 2 virtual block VBL2 in FIG. 13 are mapped to the No. 1 and No. 2 pages PAG1 and PAG2 of the No. 10 virtual block VBL10. If the mapping table MT is updated as shown in FIG. 14, pages of the No. 2 virtual block VBL2 no longer correspond to the logical addresses LADR. For example, the No. 2 virtual block VBL2 does not include the valid page. Thus, the No. 2 virtual block VBL2 may be mapped out from the first user area UA1 (refer to S350 of FIG. 11).

FIG. 14 illustrates a case where both of the third virtual block and the fourth virtual block are No. 10 virtual block VBL10, but FIG. 14 is just an example. The fourth virtual block may be different from the third virtual block. In addition, the fourth virtual block may be variously selected from among the virtual blocks included in the first user area UA1 of the first virtual area VA1.

Copying a valid page of the No. 2 virtual block VBL2 detected as a bad block B may be performed in an idle time. The idle time implies a period in which there is not a request for writing or reading to or from the host.

If the copy of the valid page of the bad block BB is performed in the idle time, another request of the host may be performed without a delay. Thus, a response time to a request of the host in the memory apparatus MEMA of FIG. 1 may be prevented from being delayed, and thus, a performance of the memory apparatus MEMA may be improved.

FIGS. 12 through 14 illustrate cases where the bad block is detected due to a failure of the write operation, responsive to a request of the host. The bad block may be detected due to a failure of the erase operation. In addition, the bad block may be detected during a performance of a garbage collection.

The garbage collection is an operation of copying a valid page of a source block including the valid page and an invalid page to a target block and then erasing the source block. Copying the valid page of the source block into the target block implies that valid data stored in the valid page of the source block is written to the target block.

If a write operation failed during writing to the target block, the target block may be detected as a bad block. If an operation of copying the valid page of the source block into the target block is successfully completed, an erase operation is performed on the source block. If the erase operation failed, the source block may be detected as a bad block.

A case where a bad block is detected during a performance of the garbage collection is explained with reference to FIGS. 15 through 17.

Figure 15:
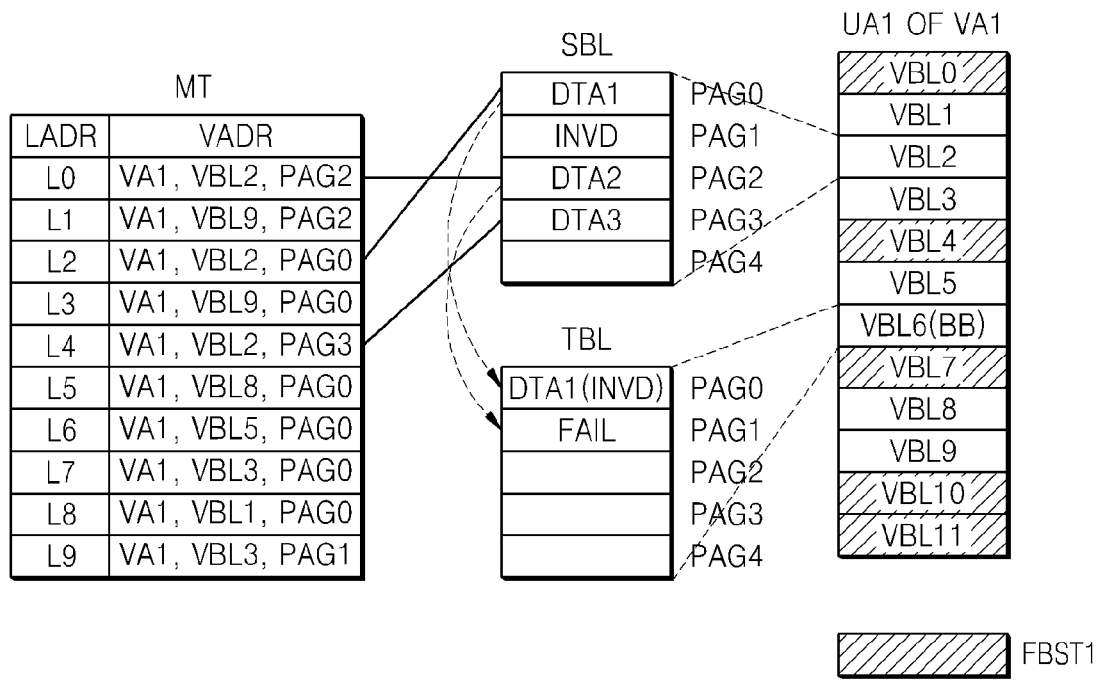

FIG. 15 is a diagram illustrating an example of a case where a bad block is detected due to a failure of the write operation during a performance of the garbage collection. In FIG. 15, it is assumed that the No. 2 virtual block VBL2 of the first user area UA1 is a source block SBL and the No. 6 virtual block VBL6 of the first user area UA1 is a target block TBL.

Referring to FIG. 15, in the first user area UA1 of the first virtual area VA1, the No. 2 virtual block VBL2, which is the source block SBL, includes valid pages PAG0, PAG2, and PAG3, in which valid data DTA1, DTA2, and DTA3 is stored.

An operation of copying the valid pages PAG0, PAG2, and PAG3 of the No. 2 virtual block VBL2 into the No. 6 virtual block VBL6 of the first user area UA1, which is the target block TBL, is performed. First, the first data DTA1 stored in the No. 0 page PAG0 of the No. 2 virtual block VBL2 is written to the No. 0 page PAG0 of the No. 6 virtual block VBL6. An operation of writing the second data DTA2 stored in the No. 2 page PAG2 of the No. 2 virtual block VBL2 to the No. 1 page PAG1 of the No. 6 virtual block VBL6 is performed, but this write operation may fail.

The No. 6 virtual bock VBL 6, which is the target block TBL, may be detected as a bad block BB due to a failure FAIL of the operation of writing the second data DTA2, and the No. 11 virtual block VBL11 of the global reserved area GRA of FIG. 4 may be assigned to the first user area UA1.

The logical address L2 corresponding to the No. 0 page PAG0 of the No. 2 virtual block VBL 2 in the mapping table MT is not changed because the garbage collection failed. Thus, although the first data DTA1 is stored in the No. 0 page PAG0 of the No. 6 virtual block VBL6, the No. 0 page PAG0 is an invalid page.

Because the No. 6 virtual bock VBL 6, which is the target block TBL, is detected as a bad block due to a failure of the write operation during a performance of the garbage collection, a write operation should be performed again on a third virtual block (refer to S320 of FIG. 11). The third virtual block may be a new target block.

Figure 16:
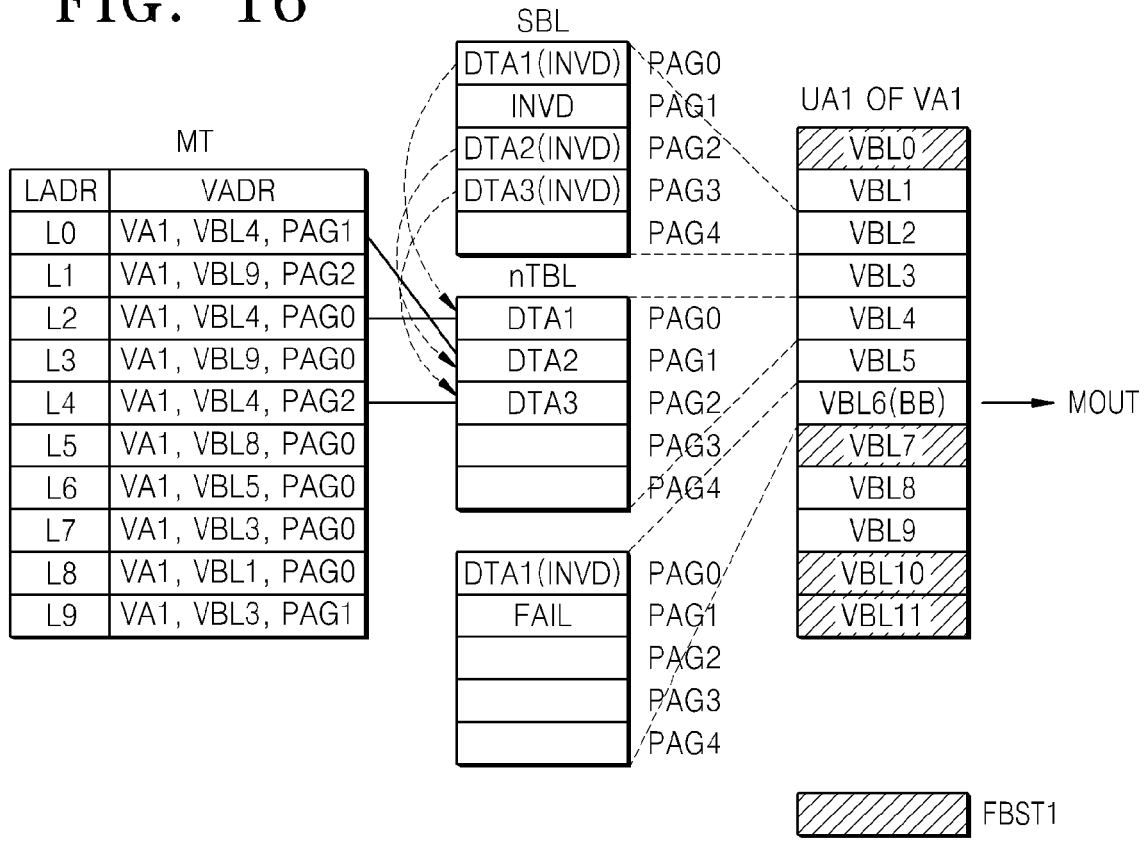

FIG. 16 is a diagram illustrating an example of a case where the write operation is performed again on the third virtual block when a bad block is detected as in FIG. 15.

Referring to FIGS. 15 and 16, the No. 4 virtual block VBL 4 included in the first free block set FBST1 of FIG. 15, instead of the No. 6 virtual block VBL6, is selected as the third virtual block, namely the new target block nTBL and then the write operation is performed again.

Thus, the valid pages PAG0, PAG2, and PAG3 of the No. 2 virtual block VBL2 are copied into the Nos. 0 through 2 pages PAG0 through PAG2 of the No. 4 virtual block VBL4, which is the new target block.

As shown in FIG. 16, the mapping table MT may be updated so that the logical addresses L2, L0, and L4 corresponding to the Nos. 0, 2, and 3 pages PAG0, PAG2, and PAG3 of the No. 2 virtual block VBL2 in FIG. 15 are mapped to the Nos. 0 through 2 pages PAG0 through PAG2 of the No. 4 virtual block VBL4.

If the mapping table MT is updated, the Nos. 0, 2, and 3 pages PAG0, PAG2, and PAG3 of the No. 2 virtual block VBL2, which is the source block SBL, no longer correspond to the logical addresses LADR, and thus, the No. 2 virtual block VBL2 no longer includes the valid page. For example, all data stored in the No. 2 virtual block VBL 2 become invalid data INVD. Thus, an erase operation is performed on the No. 2 virtual block VBL2, which is the source block SBL.

Although not illustrated in FIG. 16, if the No. 2 virtual block VBL2 is erased, the No. 2 virtual block VBL2 may be included in the first free block set FBST1.

Because the No. 6 virtual block VBL6 detected as a bad block BB does not include a valid page, the No. 6 virtual block VBL6 may be mapped out (MOUT) from the first user area UA1 (refer to S350 of FIG. 11).

However, although an erase operation is performed on the No. 2 virtual block VBL2, which is the source block SBL, the erase operation may fail.

Figure 17:
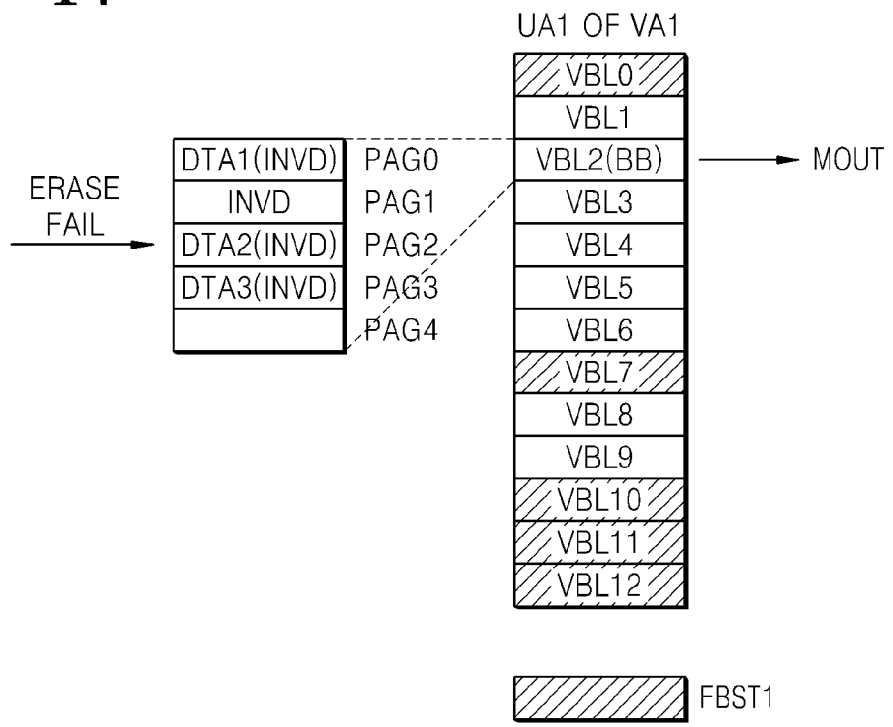

FIG. 17 is a diagram illustrating an example of a case where a bad block is detected due to a failure of the erase operation. FIG. 17 illustrates a case where the erase operation failed although the erase operation is performed on the No. 2 virtual block VBL2, which is the source block SBL.

Referring to FIG. 17, the No. 2 virtual block VBL2 is detected as a bad block BB due to a failure of the erase operation. In FIG. 17, it is assumed that the No. 12 virtual block VBL12 of the global reserved area GRA of FIG. 4 is assigned to the first user area UA1. The No. 12 virtual block VBL12 is included in the first free block set FBST1.

Because the No. 2 virtual block VBL2 is a virtual block detected as a bad block due to a failure of the erase operation other than a failure of the write operation and does not include a valid page, the No. 2 virtual block VBL2 may be mapped out from the first user area UA1 (refer to S350 of FIG. 11).

Figure 18:
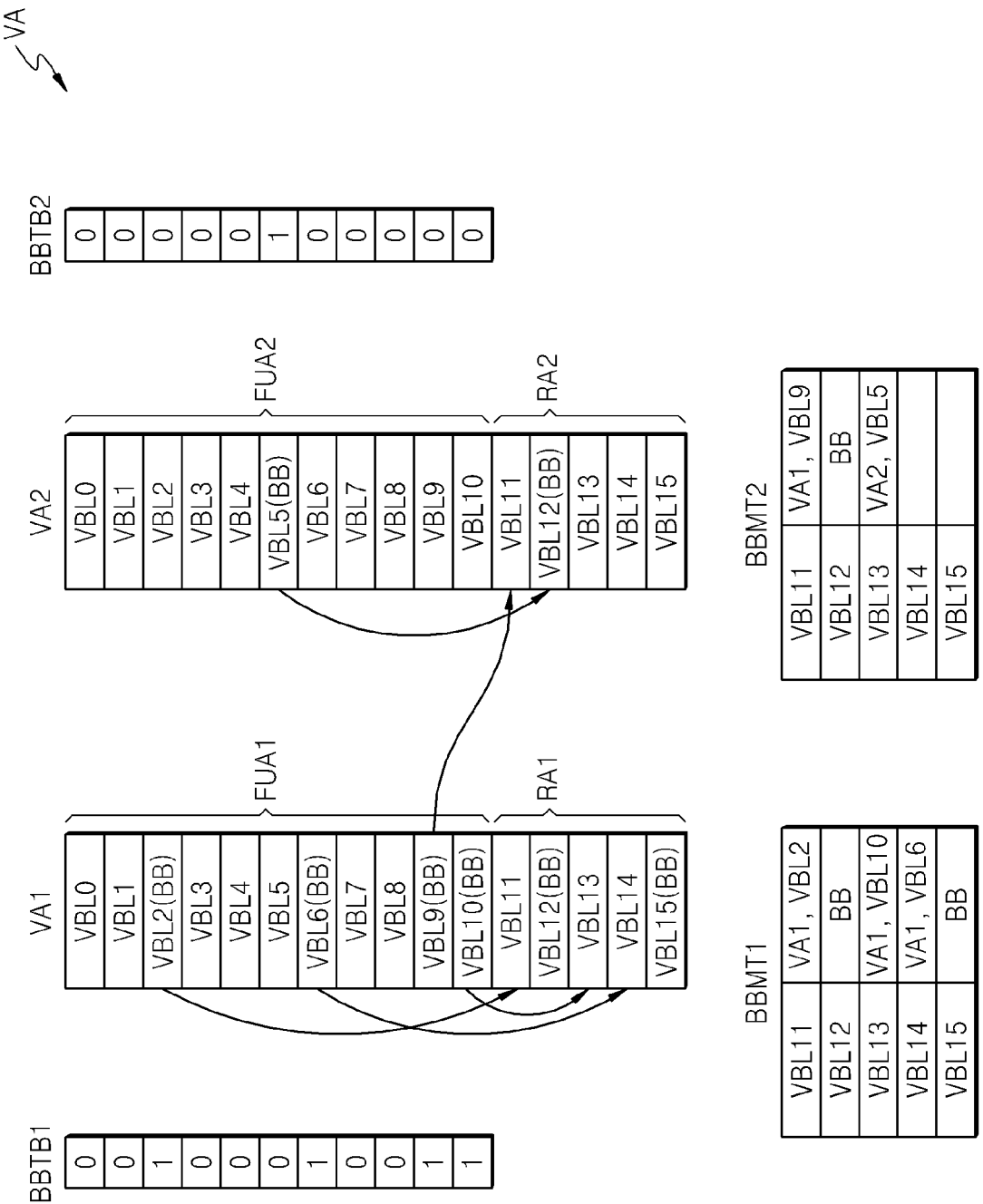
Figure 19:
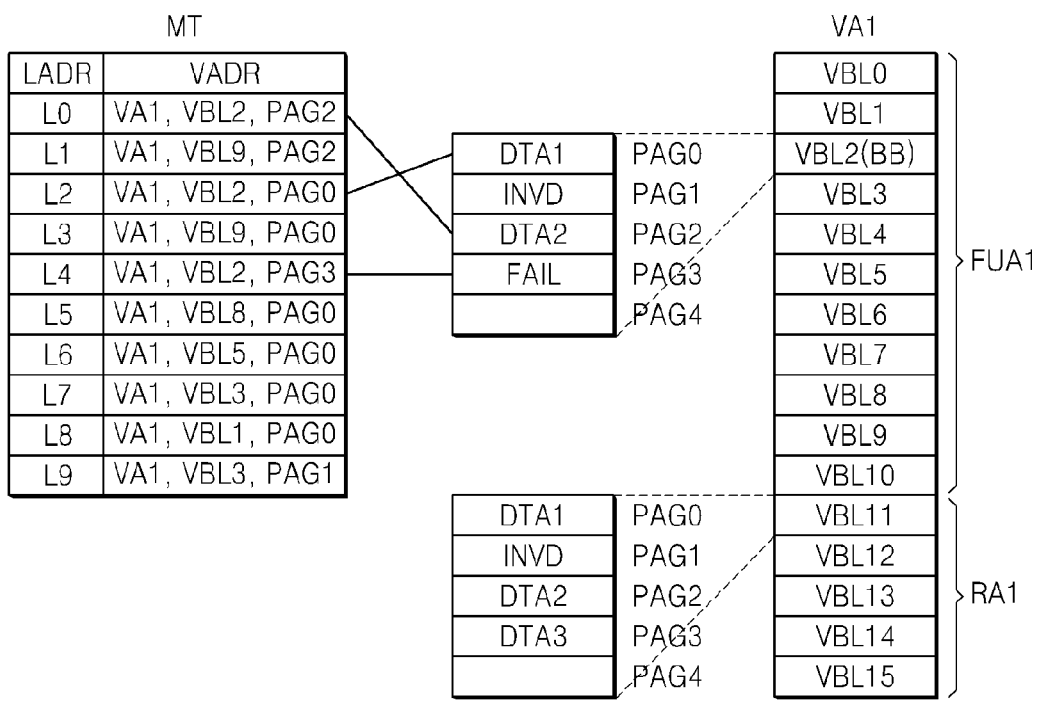

FIGS. 18 and 19 are diagrams each illustrating an example of a virtual area in the case of managing a bad block differently from the embodiment of the inventive concepts.

Referring to FIGS. 18 and 19, a virtual area VA includes a first virtual area VA1 for a first memory chip and a second virtual area VA2 for a second memory chip. The virtual area VA of FIG. 18, different from the virtual area of FIG. 4, does not include the global reserved area GRA.

The first virtual area VA1 includes a first fixed user area FUA1 and a first reserved area RA1, and the second virtual area VA2 includes a second fixed user area FUA2 and a second reserved area RA2. The first and second fixed user areas FUA1 and FUA2 of FIG. 18 are not dynamically assigned but fixed, different from the first and second user areas UA1 and UA2 of FIG. 4.

In FIGS. 18 and 19, the first and second fixed user areas FUA1 and FUA2, which may be mapped to logical addresses, are fixed. For example, a case where the No. 2 virtual block VBL2 of the first fixed user area FUA1 is detected as a bad block BB is explained below.

It is assumed that data DTA1, INVD, and DTA2 is stored in the Nos. 0 through 2 pages PAG0 through PAG2 of the No. 2 virtual block VBL2 and the No. 2 virtual block VBL2 is detected as a bad block BB due to a failure (FAIL) of an operation of writing the third data DTA3 to the No. 3 page PAG3. The write operation of writing the third data DTA3 to the No. 3 page PAG3 may be performed in response to a request of the host for the No. 4 logical address L4.

The No. 2 virtual block VBL2 detected as a bad block BB may be mapped to a virtual block of reserved areas RA1 and RA2, for example, a virtual block VBL11. Here, after the data DTA1, INVD, and DTA2 stored in the No. 2 virtual block VBL2 is copied into the No. 11 virtual block VBL11, the write operation of writing the third data DTA3 to the No. 3 page PAG3 of the No. 11 virtual block VBL11 is performed.

However, because the first fixed user area FUA1 is fixed, the mapping table MT is not changed although the No. 2 virtual block VBL2 is detected as the bad block BB. For example, the No. 4 logical address L4 is still mapped to the virtual address VADR indicating the No. 3 page PAG3 of the No. 2 virtual block VBL2 of the first virtual area VA1

Thus, in FIGS. 18 and 19, it is desired to manage information about a virtual block detected as the bad block BB in the first and second fixed user areas FUA1 and FUA2 and information about a virtual block of the first and second reserved areas RA1 and RA2, which is mapped to the virtual block detected as the bad block BB.

The information about the virtual block detected as the bad block BB in the first and second fixed user areas FUA1 and FUA2 may be managed through first and second bad block tables BBTB1 and BBTB2. The first and second bad block tables BBTB1 and BBTB2 may indicate, by using a bitmap method, whether virtual blocks VBL0 through VBL10 included in the first and second fixed user areas FUA1 and FUA2 are bad blocks. For example, the Nos. 2, 6, 9, and 10 virtual blocks VBL2, VBL6, VBL9, and VBL10 of the first fixed user area FUA1 may be bad blocks BB.

The bad blocks BB generated in the first and second fixed user area FUA1 and FUA2 are mapped to virtual blocks in the first and second reserved areas RA1 and RA2. The No. 2 virtual block VBL2, which is the bad block BB, of the first fixed user area FUA1 may be mapped to the No. 11 virtual block VBL11 of the first reserved area RA1.

Information about a virtual block of the first and second reserved areas RA1 and RA2, which is mapped to a virtual block detected as the bad block BB in the first and second fixed user areas FUA1 and FUA2, may be managed through first and second bad block mapping tables BBMT1 and BBMT2. For example, the first bad block mapping table BBMT1 indicates that the No. 13 virtual block VBL13 of the first reserved area VA1 is mapped to the No. 10 virtual block VBL10 of the first virtual area VA1.

When the virtual area VA is in a state such as shown in FIGS. 18 and 19, a case where a data read request for the No. 2 logical address L2 is generated is explained below.

The No. 2 logical address L2 is converted into the virtual address VADR indicating the No. 0 page PAG0 of the No. 2 virtual block VBL2 of the first virtual area VA1 based on the mapping table MT. Referring to the first bad block table BBTB1, the No. 2 virtual block VBL2 is a bad block BB. Thus, it is desired to search for a virtual block of the first or second reserved area RA1 or RA2, which is mapped to the No. 2 virtual block VBL2.

If the first and second bad block mapping tables BBMT1 and BBMT2 are searched, the No. 2 virtual block VBL2 is mapped to the No. 11 virtual block VBL11 of the first reserved area RA1. Thus, a data read request for the No. 2 logical address L2 is performed by accessing the No. 11 virtual block VBL11.

In the case where the bad block is managed as illustrated in FIGS. 18 and 19, when there is a request including the logical address LADR from the host, it is desired to convert the logical address LADR into the virtual address VADR of the first or second fixed user area FUA1 or FUA2 and confirm whether a virtual block corresponding to a converted virtual address VADR is a bad block.

It is assumed that there is a request of the host to the No. 9 virtual block VBL9 of the first virtual area VA1, which is a bad block BB. The first and second bad block mapping tables BBMT1 and BBMT2 should be searched to find whether the No. 9 virtual block VBL9 of the first virtual area VA1 is mapped to any virtual block of the first and second reserved areas RA1 and RA2.

The No. 9 virtual block VBL9 of the first virtual area VA1 is mapped to the No. 11 virtual block VBL11 of the second reserved area RA2 of the second virtual area VA2. Thus, it is desired to search the second bad block mapping table BBMT2 for the second memory chip CH2 as well as the first bad block mapping table BBMT for the first memory chip CH1 to find whether the No. 9 virtual block VBL9 of the first virtual area VA1 is mapped to any virtual block of the first and second reserved areas RA1 and RA2. Thus, a search time may be more increased.

The first and second bad block mapping tables BBMT1 and BBMT2 should be linearly searched to find a virtual block of the first or second reserved area RA1 or RA2, which is mapped to a virtual block detected as a bad block in the first and second fixed user areas FUA1 and FUA2. Thus, a search time is required to perform the request of the host. Thus, a response time for the request of the host is delayed in the memory apparatus MEMA.

Referring back to FIG. 19, if the No. 2 virtual block VBL2, which is a bad block BB, is mapped to the No. 11 virtual block, the data DTA1, INVD, and DTA2 stored in the No. 2 virtual block VBL2 are copied into the No. 11 virtual block VBL11 and then a write operation for the third data DTA3 is performed again on the No. 3 page PAG3 of the No. 11 virtual block VBL11.

In the case of managing a bad block according to an embodiment of the inventive concepts, as illustrated in FIG. 14, the valid pages PAG0 and PAG2 of the No. 2 virtual block VBL2 detected as the bad block BB may be copied into the No. 10 virtual block VBL10 during an idle time. This is because the No. 2 virtual block VBL2 detected as the bad block BB in FIG. 14 is included in the first user area UA1 before being mapped out. In addition, in the embodiment of the inventive concepts, the No. 2 virtual block VBL2 detected as the bad block BB is not mapped to another virtual block. Thus, because the No. 2 virtual block VBL2 may be accessed until being mapped out from the first user area UA1, the No. 2 virtual block VBL2 may be processed during the idle time.

However, in the cases of FIGS. 18 and 19, which do not depend on the embodiment of the inventive concepts, the No. 2 virtual block VBL2 detected as the bad block BB is mapped to the No. 11 virtual block VBL11, which is another virtual block. If the No. 2 virtual block VBL2 is mapped to the No. 11 virtual block VBL11, the memory apparatus accesses the No. 11 virtual block VBL11 instead of the No. 2 virtual block VBL2. For example, if the No. 2 virtual block VBL2 is mapped to the No. 11 virtual block VBL11, the memory apparatus may not access the No. 2 virtual block VBL2. Thus, if the No. 2 virtual block VBL2, which is the bad block BB, is mapped to the No. 11 virtual block VBL11, data stored in the No. 2 virtual block VBL2 should be copied into the No. 11 virtual block VBL11. A response time of the memory apparatus to a request of the host is delayed due to an overhead of a copy operation.

In the embodiment of the inventive concepts, the virtual blocks included in the reserved areas of the plurality of the memory chips are managed as the global reserved area. If a bad block is generated in the user area, the bad block of the user area is not mapped to a virtual block of the reserved area, but a virtual block of the global reserved area is assigned to the user area. For example, the user area is not fixed but dynamically assigned.

Thus, in a memory apparatus according to the embodiment of the inventive concepts, it is not necessary to manage the first and second bad block tables BBTB1 and BBTB2 and the first and second bad block mapping tables BBMT1 and BBMT2 of FIG. 18.

In addition, in the memory apparatus according to the embodiment of the inventive concepts, a bad block of the user area is not mapped to a virtual block of the reserved area. Thus, because it is not necessary to search for a virtual block of the reserved area into which a bad block of the user area is mapped, a search time such as stated with reference to FIGS. 18 and 19 is not required. In addition, in the memory apparatus according to the embodiment of the inventive concepts, invalid pages of the bad block may be processed during the idle time. Thus, it is possible to prevent a response time to a request of the host from being delayed. As a result, a performance of the memory apparatus may be improved.

In this manner, according to the embodiment of the inventive concepts, the memory apparatus capable of efficiently managing a bad block may be provided.

In the above, the method of managing a bad block has been explained for the two memory chips, namely, the first and second memory chips CH1 and CH2 of FIG. 1, according to the embodiment of the inventive concepts. The method of managing a bad block may be applied also to a case where the memory apparatus according to the embodiment of the inventive concepts include more than two memory chips.

Figure 20:
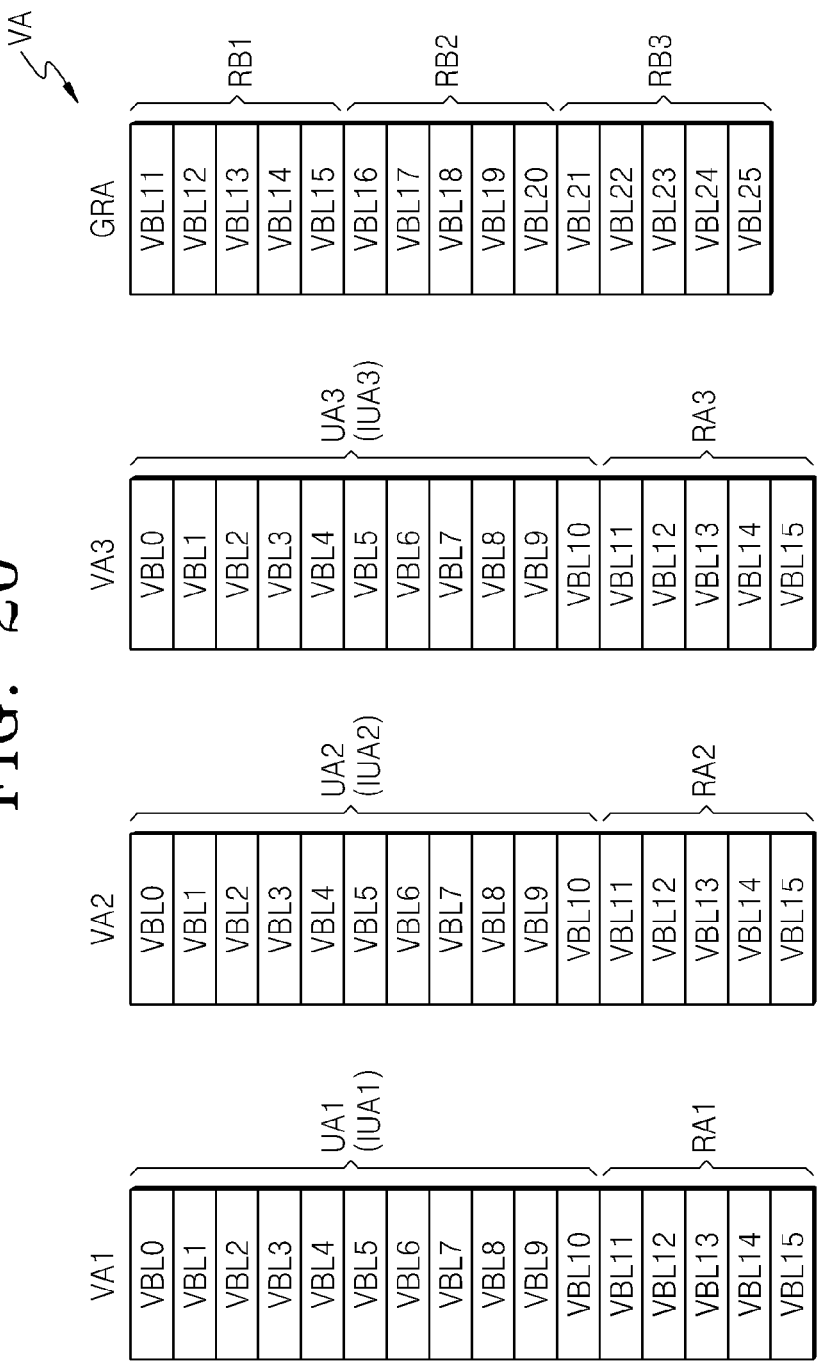

FIG. 20 is a diagram illustrating an example of a virtual area VA for three memory chips, in a case where the memory apparatus according to the embodiment of the inventive concepts include the three memory chips.

Referring to FIG. 20, the virtual area VA includes a global reserved area GRA and first through third virtual areas VA1, VA2, and VA3 for the three memory chips.

The first virtual area VA1 includes a first user area UA1 and a first reserved area RA1 that correspond to a first memory chip of the three memory chips, the second virtual area VA2 includes a second user area UA2 and a second reserved area RA2 that correspond to a second memory chip of the three memory chips, and the third virtual area VA3 includes a third user area UA3 and a third reserved area RA3 that correspond to a third memory chip of the three memory chips.

The global reserved area GRA includes a first plurality of reserved blocks RB1 (VBL11 through VBL15) corresponding to a first reserved area RA1 (VBL11 through VBL15) of the first virtual area VA1, a second plurality of reserved blocks RB2 (VBL16 through VBL20) corresponding to a second reserved area RA2 (VBL11 through VBL15) of the second virtual area VA2, and a third plurality of reserved blocks RB3 (VBL21 through VBL25) corresponding to a third reserved area RA3 (VBL11 through VBL15) of the third virtual area VA3.

The memory apparatus explained above may be an electronic apparatus or may be included in the electronic apparatus. The electronic apparatus may be embodied in various forms such as a computing system apparatus, a memory card, a server computer, a digital camera, a camcorder, a mobile phone, and the like.

Figure 21:
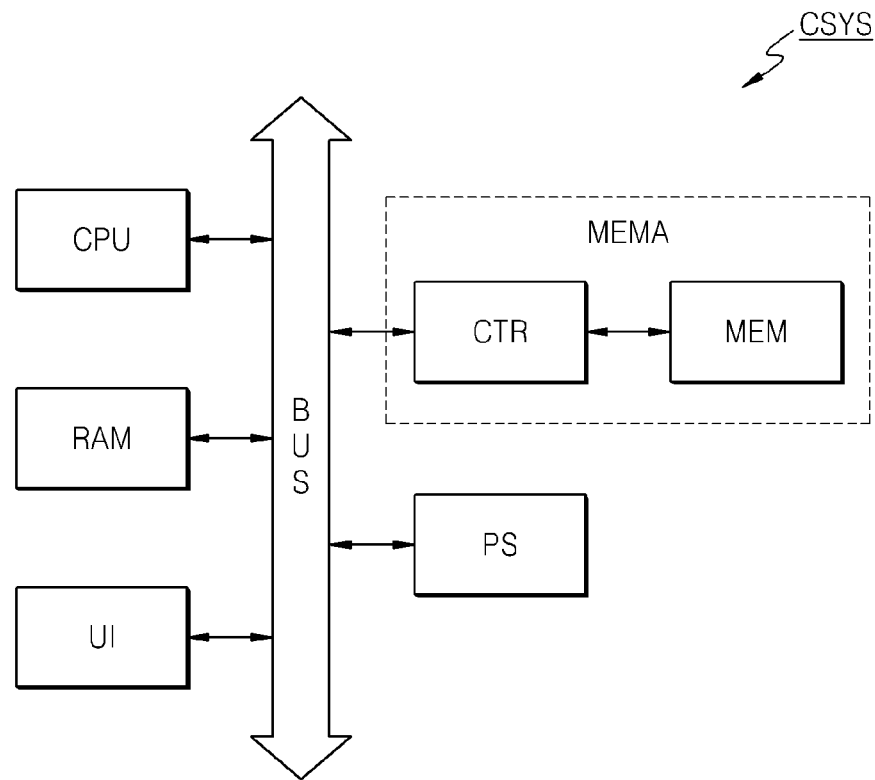

FIG. 21 is a block diagram illustrating a computing system CSYS including the memory apparatus MEMA according to the embodiment of the inventive concepts.

Referring to FIG. 21, the computing system CSYS includes a processor CPU, a user interface UI, and the memory apparatus MEMA, which are electrically connected to each other via a bus BUS. The memory apparatus MEMA includes a memory MEM and a control unit CTR. Data processed or to be processed by the processor CPU is stored in the memory MEM through the control unit CTR. The memory apparatus MEMA of FIG. 21 may be the same as the memory apparatus MEMA of FIG. 1.

The computing system CSYS may further include a power supply device PS and a volatile memory, for example, a random access memory (RAM).

In a case where the computing system CSYS is a mobile device, the computing system CSYS may further include a battery (not shown) for supplying an operating voltage to the computing system CSYS and a modem (not shown) such as a baseband chipset. In addition, although not shown, the computing system CSYS may further include an application chipset, a camera image processor (CIS), a mobile dynamic random access memory (DRAM), and the like.

Figure 22:
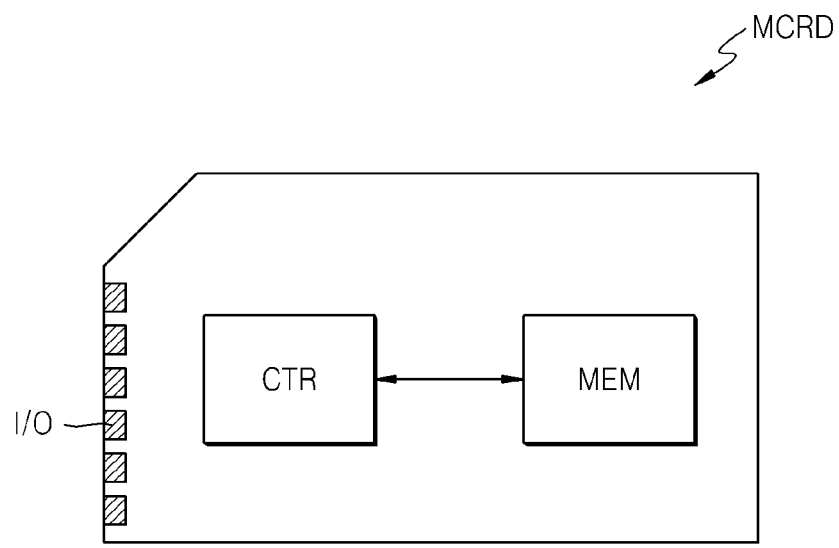

FIG. 22 is a diagram illustrating a memory card MCRD according to an embodiment of the inventive concepts.

Referring to FIG. 22, the memory card MCRD includes a control unit CTR and a memory MEM. The control unit CTR controls a data writing to the memory MEM or a data reading from the memory MEM in response to a request received through an input and output unit I/O (not shown) from an external host (not shown). In addition, the control unit CTR may control an erase operation of the memory MEM. The memory card MCRD according to the embodiment of the inventive concepts may be embodied with the memory apparatus MEMA of FIG. 1.

The memory card MCRD of FIG. 22 may be embodied as a compact flash card (CFC), a microdrive, a smart media card (SMC), a multimedia card (MMC), a security digital card (SDC), a memory stick or a universal serial bus (USB) flash memory drive.

Figure 23:
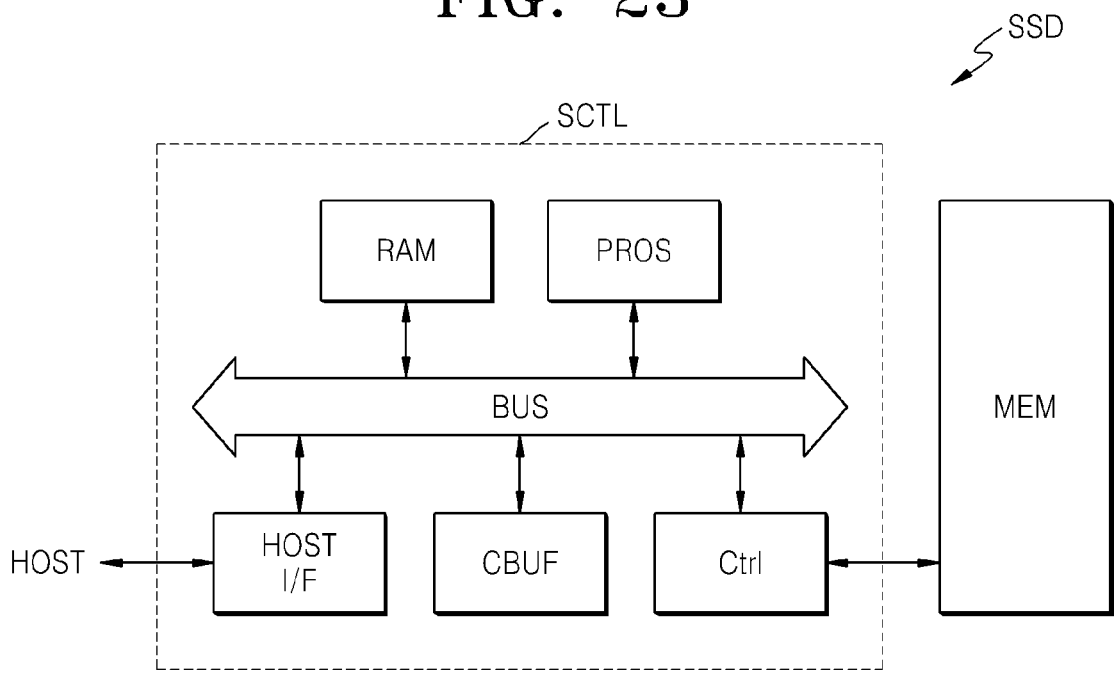

FIG. 23 is a block diagram illustrating a solid state drive (SSD) according to an embodiment of the inventive concepts.

Referring to FIG. 23, the SSD includes a solid state drive controller SCTL and a memory MEM. The solid state drive controller SCTL may include a processor PROS, a RAM, a cache buffer CBUF, and a memory controller Ctrl, which are connected to each other via a bus BUS. The processor PROS controls the memory controller Ctrl to transmit and receive data with respect to the memory MEM in response to a request of a host (not shown). The processor PROS and memory controller Ctrl of the SSD according to an embodiment of the inventive concepts may be embodied as a single advanced reduced instruction set computer machine (ARM) processor. Information required for an operation of the processor PROS may be loaded to the RAM.

A host interface HOST I/F receives the request of the host and then transmits the request to the processor PROS, or transmits data received from the memory MEM to the host. The host interface HOST I/F may interface with the host by using various interface protocols such as universal serial bus (USB), man machine communication (MMC), peripheral component interconnect-express (PCI-E), serial advanced technology attachment (SATA), parallel advanced technology attachment (PATA), small computer system interface (SCSI), enhanced small device interface (ESDI), intelligent drive electronics (IDE), and the like. Data to be transmitted to the memory MEM or data transmitted from the memory MEM may be temporarily stored in the cache buffer CBUF. The cache buffer CBUF may be a static random access memory (SRAM) and the like.

The SSD according to the embodiment of the inventive concepts may be embodied with the memory apparatus MEMA of FIG. 1. The memory controller Mctr of FIG. 1 may be embodied with the memory controller Ctrl of FIG. 23, and the buffer BUF of FIG. 1 may be embodied with the RAM and the cache buffer CBUF of FIG. 23.

Figure 24:
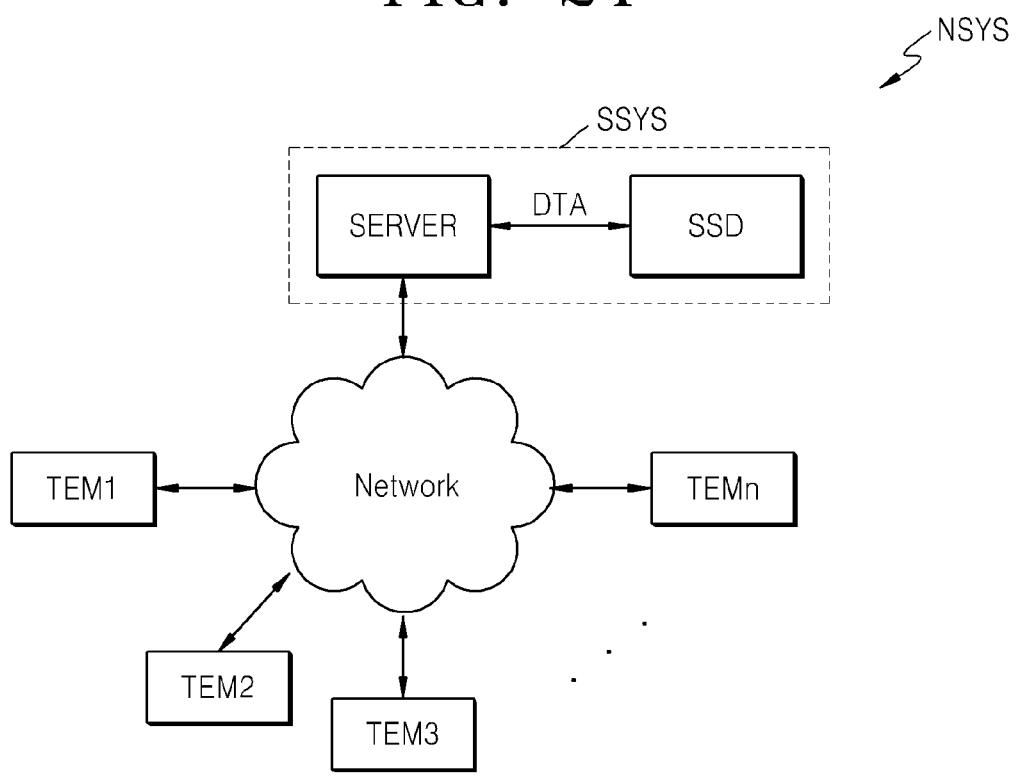

FIG. 24 is a diagram illustrating a server system SSYS including the solid state drive SSD and a network system NSYS including the server system SSYS.

Referring to FIG. 24, the network system NSYS may include the server system SSYS and a plurality of terminals TEM1 through TEMn, which are connected to each other through a network. The server system SSYS may include a server SERVER processing requests received from the plurality of terminals TEM1 through TEMn and the SSD storing data corresponding to the requests received from the plurality of terminals TEM1 through TEMn. Here, the SSD of FIG. 24 may be the SSD of FIG. 23. In other words, the SSD of FIG. 24 may include the SSD controller SCTL and the memory MEM, and may be embodied with the memory apparatus MEMA of FIG. 1.

The inventive concepts have been particularly shown and described with reference to example embodiments thereof. Here, although the specific terms have been used to describe the inventive concepts, these terms are for the purpose of describing the inventive concepts only and are not intended to limit the meaning of the inventive concepts or the scope of the inventive concepts as defined by the following claims. Therefore, it will be understood by those of ordinary skill in the art that various changes in form and details may be made therein without departing from the spirit and scope of the inventive concepts as defined by the following claims.

What is claimed is:

1. A memory apparatus comprising:
a first memory chip and a second memory chip; and
a control unit configured to manage a global reserved area, a first virtual area for the first memory chip, and a second virtual area for the second memory chip,
wherein the first virtual area includes a first user area and a first reserved area, the second virtual area includes a second user area and a second reserved area, the global reserved area includes a first plurality of reserved blocks corresponding to the first reserved area and a second plurality of reserved blocks corresponding to the second reserved area, and, the control unit is configured to assign a second virtual block included in the global reserved area to the first user area if the control unit detects a first virtual block included in the first user area is a bad block.

2. The memory apparatus of claim 1, wherein the control unit is configured to map out the first virtual block from the first user area if the first virtual block does not comprise a valid page.

3. The memory apparatus of claim 2, wherein the control unit is configured to detect the first virtual block as the bad block if a write operation to the first virtual block fails and perform the write operation on a third virtual block included in the first user area, and the control unit is configured to detect the first virtual block as the bad block if an erase operation for the first virtual block fails.

4. The memory apparatus of claim 3, wherein the control unit is configured to copy the valid page into a fourth virtual block included in the first user area and then map out the first virtual block from the first user area if the first virtual block detected as the bad block includes the valid page.

5. The memory apparatus of claim 4, wherein the first virtual block is mapped to a logical address before the valid page is copied into the fourth virtual block, and the logical address is mapped to the fourth virtual block if the valid page is copied into the fourth virtual block.

6. The memory apparatus of claim 5, wherein the control unit is configured to copy the valid page into the fourth virtual block during an idle time.

7. The memory apparatus of claim 1, wherein the first user area and the second user area each include a free block set that is not mapped to a logical address, and the control unit is configured to assign the second virtual block to the free block set of the first user area.

8. The memory apparatus of claim 1, wherein the control unit is configured to select an unused virtual block of the second plurality of reserved blocks as the second virtual block and assign the second virtual block to the first user area if there is no unused virtual block from among the first plurality of reserved blocks included in the global reserved area.

9. The memory apparatus of claim 8, wherein the control unit comprises:
a buffer configured to load a global reserved area table indicating whether the first plurality of reserved blocks and the second plurality of reserved blocks are used; and
a processor configured to manage the global reserved area table.

10. The memory apparatus of claim 9, wherein the processor is configured to update the global reserved area table to indicate that the second virtual block is a used block if the second virtual block included in the global reserved area is assigned to the first user area.

11. An electronic apparatus comprising:
a memory including a plurality of memory chips; and
a control unit configured to manage a global reserved area and a virtual area for the plurality of memory chips,
wherein the virtual area includes a plurality of user areas and a plurality of reserved areas, which correspond to the plurality of memory chips, the global reserved area includes a plurality of reserved blocks corresponding to the plurality of reserved areas, and the control unit is configured to assign a second virtual block of the plurality of reserved blocks to the first user area and map out the first virtual block from the first user area if the control unit detects a first virtual block included in a first user area of the plurality of user areas is a bad block.

12. The electronic apparatus of claim 11, wherein, if the first virtual block comprises a valid page, the control unit is configured to copy the valid page into a virtual block of a plurality of virtual blocks included in the first user area and then map out the first virtual block from the first user area.

13. The electronic apparatus of claim 12, wherein each of the plurality of memory chips comprises a flash memory.

14. The electronic apparatus of claim 13, wherein the memory is included in a solid state drive (SSD).

15. The electronic apparatus of claim 14, wherein the memory is included in a server.

16. A memory apparatus comprising: a first memory chip and a second memory chip;
and a control unit configured to manage a global reserved area, a first virtual area for the first memory chip and a second virtual area for the second memory chip, wherein the global reserved area includes a plurality of blocks corresponding to both the first virtual area and the second virtual area, and the control unit configured to assign an unused virtual block of the global reserved area to the first virtual area if the control unit detects a first virtual block included in the first virtual area is a bad block.

17. The memory apparatus of claim 16, wherein the control unit is configured to map out the first virtual block from the first virtual area if the first virtual block does not comprise a valid page.

18. The memory apparatus of claim 17, wherein the control unit is configured to detect the first virtual block as the bad block if a write operation to the first virtual block fails and perform the write operation on a third virtual block included in the first virtual area, and the control unit is configured to detect the first virtual block as the bad block if an erase operation for the first virtual block fails.

19. The memory apparatus of claim 18, wherein the control unit is configured to copy the valid page into a fourth virtual block included in the first virtual area and then map out the first virtual block from the first virtual area if the first virtual block detected as the bad block includes the valid page.

* * * * *